(12) United States Patent
Fukushima et al.

(10) Patent No.: US 8,101,502 B2
(45) Date of Patent: Jan. 24, 2012

(54) SEMICONDUCTOR DEVICE AND ITS MANUFACTURING METHOD

(75) Inventors: Yasumori Fukushima, Osaka (JP); Yutaka Takafuji, Osaka (JP); Kazuhide Tomiyasu, Osaka (JP); Michiko Takei, Osaka (JP); Steven Droes, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 4 days.

(21) Appl. No.: 12/600,813

(22) PCT Filed: Apr. 1, 2008

(86) PCT No.: PCT/JP2008/000843
§ 371 (c)(1),
(2), (4) Date: Nov. 18, 2009

(87) PCT Pub. No.: WO2009/013849
PCT Pub. Date: Jan. 29, 2009

(65) Prior Publication Data
US 2010/0155905 A1      Jun. 24, 2010

(30) Foreign Application Priority Data
Jul. 26, 2007   (JP) ................................. 2007-195069

(51) Int. Cl.
*H01L 21/22* (2006.01)
(52) U.S. Cl. .................... 438/458; 438/455; 438/459
(58) Field of Classification Search ................ 438/458, 438/455, 459
See application file for complete search history.

(56) References Cited

U.S. PATENT DOCUMENTS
2005/0067619 A1   3/2005  Takafuji et al.

FOREIGN PATENT DOCUMENTS

| JP | 8-37187 A | 2/1996 |
|---|---|---|
| JP | 9-51034 A | 2/1997 |
| JP | 9-74136 A | 3/1997 |
| JP | 11-297972 A | 10/1999 |
| JP | 2001-28354 A | 1/2001 |
| JP | 2001-332620 A | 11/2001 |
| JP | 2003-234455 A | 8/2003 |
| JP | 2005-26472 A | 1/2005 |
| JP | 2005-93757 A | 4/2005 |

OTHER PUBLICATIONS

Chinese Office Action dated Feb. 23, 2011 with English Translation.
Michel Bruel et al., "Smart-Cut: A New Silicon on Insulator Material Technology Based on Hydrogen Implantation and Wafer Bonding", Jpn. J. Appl. Phys. vol. 36 (1997), pp. 1636-1641, Part 1, No. 3B, Mar. 1997.
M. Bruel, "Silicon on insulator material technology", Electronics Letters Jul. 6, 1995, vol. 31, No. 14, pp. 1201-1202.

*Primary Examiner* — Long Pham
(74) *Attorney, Agent, or Firm* — Birch, Stewart, Kolasch & Birch, LLP

(57) ABSTRACT

A device portion forming step includes an assisting layer forming step of forming a planarization assisting layer, which covers a plurality of conductive films, over a first planarizing layer before forming a second planarizing layer. In the assisting layer forming step, the planarization assisting layer is formed so that a height of the planarization assisting layer from a surface of the first planarizing layer located on a side opposite to the substrate layer becomes equal between at least a part of a region where the conductive films are formed, and at least a part of a region where no conductive film is formed.

13 Claims, 17 Drawing Sheets

SEMICONDUCTOR DEVICE AND ITS MANUFACTURING METHOD

TECHNICAL FIELD

The present disclosure relates to semiconductor devices that are applied to, e.g., liquid crystal display (LCD) devices and the like, and manufacturing methods thereof.

BACKGROUND ART

Conventionally, SOI (Silicon on Insulator) substrates, which are silicon substrates in which a monocrystalline silicon layer is formed on a surface of an insulating layer, are known in the art. Forming devices, such as transistors, on the SOI substrates can reduce parasitic capacitance and increase electric resistance. That is, higher device performance and integration can be obtained. The insulating layer is made of, e.g., a silicon oxide film ($SiO_2$).

In order to increase the operating speed of the devices, and further reduce the parasitic capacitance, it is desirable to reduce the thickness of the monocrystalline silicon layer of the SOI substrates. In general, various methods, such as those using mechanical polishing or chemical mechanical polishing (hereinafter referred to as "CMP"), or using porous silicon, are known as methods for forming an SOI substrate.

For example, in a method proposed as an example of a method for forming an SOI substrate by hydrogen implantation, after a hydrogen implanted layer is formed by implanting hydrogen into a semiconductor substrate, and the semiconductor substrate is bonded with another substrate, a heat treatment is performed so that a part of the semiconductor substrate is separated from the other substrate along the hydrogen implanted layer, and the remaining part of the semiconductor substrate is transferred to the other substrate, thereby forming a semiconductor layer (see Non-Patent Document 1, Non-Patent Document 2, and the like). An SOI substrate, in which a very thin monocrystalline silicon layer is formed on the surface of an insulating layer, can be formed by this method.

Moreover, in another known method, after a monocrystalline silicon layer is formed on an insulating substrate, such as a glass substrate, by the method of transferring a part of a semiconductor substrate to another substrate, monocrystalline silicon TFTs (Thin Film Transistors) are formed by the monocrystalline silicon layer (see, e.g., Patent Document 1). According to this method, since the TFTs are formed after the monocrystalline silicon layer is formed on the surface of the insulating substrate, a gate oxide film needs to be formed on the surface of the monocrystalline silicon layer formed on the insulating substrate (that is, on the separated surface formed by the hydrogen implantation).

However, the surface of the monocrystalline silicon layer, formed on the insulating substrate by transferring a part of the semiconductor substrate, has relatively high surface roughness (concaves and convexes on the surface). Thus, it is difficult to form a high quality gate oxide film, and to form high performance TFTs. Moreover, TFTs need to be finely fabricated after forming the monocrystalline silicon layer on the insulating substrate.

Thus, the applicant has proposed a method for forming a thin device portion on another substrate. In this method, after a device portion having devices, such as monocrystalline silicon TFTs, is formed on a semiconductor substrate, and a hydrogen implanted layer is formed in the semiconductor substrate, the device portion is bonded with the other substrate, and a part of the semiconductor substrate is separated, thereby forming a thin device portion on the other substrate (see, e.g., Patent Document 2).

The device portion has: a plurality of conductive films, which are formed adjacent to each other on the surface of a planarizing layer that at least partially covers the monocrystalline silicon TFTs; and an insulating film that covers the plurality of conductive layers, and the device portion is bonded with the other substrate by using the surface of the insulating layer as a bonding surface. According to this method, since monocrystalline silicon TFTs are formed in advance on the semiconductor substrate, no gate oxide film needs to be formed on the separated surface formed by the hydrogen implantation, and high performance monocrystalline silicon TFTs can be formed. Moreover, since microfabrication of the TFTs is performed on the semiconductor substrate, the same level of dimensional reduction as that achieved by state-of-the-art microfabrication accuracy of silicon LSI (Large Scale Integration) can in principle be implemented without being subject to the limitations of microfabrication accuracy on insulating substrates. Moreover, using a transparent substrate as the other substrate enables the semiconductor device having a thin semiconductor layer to be applied to LCD devices.

Thus, reliable bonding between the device portion and the glass substrate is required in the case of forming the device portion on the other substrate by bonding the device portion, formed on the semiconductor substrate, with the other substrate. In order to reliably bond the device portion and the other substrate together, it is desirable that both the device portion and the other substrate have very flat bonding surfaces. Thus, the surface of the insulating layer is planarized by a CMP method in order to improve the flatness of the bonding surface of the device portion.

Patent Document 1: Japanese Published Patent Application No. 2003-234455
Patent Document 2: Japanese Published Patent Application No. 2005-26472
Non-Patent Document 1: Electronics Letters, Vol. 31, No. 14, 1995, pp. 1201-1202
Non-Patent Document 2: Jpn. J. Appl. Phys. Vol. 36 (1997), pp. 1636-1641

DISCLOSURE OF THE INVENTION

Problems to be Solved by the Invention

However, it was found that, even if the surface of the insulating film is planarized by a CMP method as described above, the difference in height can remain in the bonding surface of the device portion due to the plurality of conductive films. The difference in height tends to remain in the bonding surface of the device portion, especially in the case where conductive films having a relatively high layout pattern density are formed. This will be described below with reference to FIGS. 37 through 41.

As shown in FIG. 37, conductive films 103a, 103b, which have different layout pattern densities from each other, are formed on a silicon substrate 101 with a planarizing layer 102, which at least partially covers devices (not shown) such as TFTs, being interposed therebetween. The conductive film 103a having a relatively small interconnect width corresponds to a metal interconnect pattern having a relatively low layout pattern density, and the conductive film 103b having a larger interconnect width than that of the conductive film 103a corresponds to a metal interconnect pattern having a relatively high layout pattern density.

As shown in FIG. 38, an insulating layer 104, such as $SiO_2$, is formed over the silicon substrate 101 by a chemical vapor deposition (CVD) method or the like so as to cover the conductive films 103a, 103b. At this time, convex portions 105, which reflect the difference in level between the surface of the planarizing layer 102 and the surfaces of the conductive films 103a, 103b, are formed in the insulating film 104.

Then, as shown in FIG. 39, the surface of the insulating layer 104, which forms the bonding surface of the device portion, is planarized by a CMP method. In the CMP method, an appropriate pressure is applied to the surface of the insulating layer 104 by a polishing pad 107 by using a slurry (an abrasive), thereby polishing and planarizing the surface of the insulating layer 104. The polishing rate of the CMP method increases as the pressure of the polishing pad 107 increases. Thus, since a larger polishing pressure is applied to corners 106 of the convex portions 105 than to flat portions 108, the corners 106 are polished at a higher rate, and the insulating layer 104 of the corners 106 is rapidly removed and planarized. Arrows 109 in FIG. 39 show the directions in which the polishing pressure is applied to the corners 106 of the convex portions 105.

FIG. 40 schematically shows how the surface of the insulating layer 104 changes by the CMP planarization. As shown in FIG. 40, the surface of the insulating layer 104 changes in the order of 110, 111, 112, and 113 as the insulating layer 104 is rubbed. That is, since the corners 106 of the convex portions 105 are polished at a higher rate, the convex portion 105, which is formed on the conductive film 103a having a small interconnect width, is polished from the corners 106, and is eventually planarized to the same surface level as that of a region where no conductive films 103a, 103b are formed.

On the other hand, the convex portion 105, which is formed on the conductive film 103b having a large interconnect width, is less likely to be planarized to the same surface level as that of the region where no conductive films 103a, 103b are formed, although the side ends of the convex portion 105 are gently sloped. That is, the height of the insulating layer 104 from the surface of the planarizing layer 102 located on the side opposite to the silicon substrate 101 (hereinafter simply referred to as the "height of the insulating layer 104") tends to be larger in a region where the conductive film 103b is formed, than in a region where no conductive film 103b is formed. Thus, the difference in height tends to remain in the surface of the insulating layer 104 (that is, the bonding surface of the device Portion).

Especially, a height h1 of the insulating layer 104 in the region where the conductive film 103b is formed, at a position sufficiently away from the outer edge of the conductive film 103b, is larger than a height h2 of the insulating layer 104 in the region where no conductive film 103b is formed, by an amount corresponding to the thickness of the conductive film 103b.

Thus, as shown in FIG. 41, in the case of bonding the device portion with a glass substrate 114, that is, another substrate, with the difference in height remaining in the bonding surface of the device portion, the insulating layer 104 in the region where the conductive film 103b is formed contacts the glass substrate 114, and bonds therewith. On the other hand, since the insulating layer 104 in the region where no conductive layer 103b is formed has a lower height than that of the insulating layer 104 in the region where the conductive film 103b is formed, a gap s is formed between the insulating layer 104 in the region where no conductive film 103b is formed, and the glass substrate 114. Thus, the insulating layer 104 in the region where no conductive film 103b is formed does not contact the glass substrate 114, and does not bond therewith.

In the surface of the insulating layer 104 at a position located sufficiently away from the conductive film 103b, the silicon substrate 101 or the glass substrate 114 is deformed or bent, whereby the glass substrate 114 and the insulating layer 104 contact and bond each other. However, in any case, there are a plurality of regions where the glass substrate 114 and the insulating layer 104 do not bond together.

As described above, in the case where the difference in height remains in the bonding surface of the device portion, defective bonding occurs between the device portion and the substrate, thereby making it difficult to reliably bond the device portion to the substrate surface.

The present invention was developed in view of the above problems, and it is an object of the present invention to reduce the thickness of a device portion having a plurality of conductive films to reliably bond the device portion to the substrate.

Means for Solving the Problems

In order to achieve the above object, a method for manufacturing a semiconductor device according to the present invention includes: a device portion forming step of forming a device portion, which has a device formed in a substrate layer, a first planarizing layer covering at least a part of the device, a plurality of conductive films formed adjacent to each other on a surface of the first planarizing layer, and a second planarizing layer covering the plurality of conductive films; a peel-off layer forming step of forming a peel-off layer by ion implanting a peel-off material to the substrate layer; a bonding step of bonding the device portion with a substrate; and a separating step of separating and removing a part of the substrate layer along the peel-off layer, wherein the device portion forming step includes an assisting layer forming step of forming a planarization assisting layer, which covers the plurality of conductive films, over the first planarizing layer before forming the second planarizing layer, and in the assisting layer forming step, the planarization assisting layer is formed so that a height of the planarization assisting layer from a surface of the first planarizing layer located on a side opposite to the substrate layer becomes equal between at least a part of a region where the conductive films are formed, and at least a part of a region where no conductive film is formed.

Moreover, a method for manufacturing a semiconductor device according to the present invention includes: a device portion forming step of forming a device portion, which has a device formed in a substrate layer, a planarizing layer covering at least a part of the device, a plurality of conductive films formed adjacent to each other on a surface of the planarizing layer, and an insulating layer covering the plurality of conductive films; a peel-off layer forming step of forming a peel-off layer by ion implanting a peel-off material to the substrate layer; a bonding step of bonding the device portion with a substrate; and a separating step of separating and removing a part of the substrate layer along the peel-off layer, wherein, in the device portion forming step, the insulating layer is formed so that a height of the insulating layer from a surface of the planarizing layer located on a side opposite to the substrate layer becomes equal between an entire region where the conductive films are formed, and at least a part of a region where no conductive film is formed, and becomes the highest in the region where the conductive films are formed.

In the assisting layer forming step, after a base layer, which covers the plurality of conductive films, is formed over the first planarizing layer, convex portions, formed in the base layer so as to reflect a difference in level between a surface of the first planarizing layer and surfaces of the conductive films, may be at least partially etched to form the planarization assisting layer.

It is preferable that, in the assisting layer forming step, each of the convex portions be entirely etched with a width of 3.0 µm or less from an outer edge of a corresponding one of the conductive films when viewed from a direction normal to a surface of the substrate layer.

It is preferable that, in the assisting layer forming step, the convex portions be etched so that a part of each convex portion is left with a width of 3.0 µm or less in a direction perpendicular to an outer edge of a corresponding one of the conductive films when viewed from a direction normal to a surface of the substrate layer.

In the device portion forming step, after a base layer, which covers the plurality of conductive films, is formed over the planarizing layer, convex portions, formed in the base layer so as to reflect a difference in level between a surface of the planarizing layer and surfaces of the conductive films, may be at least partially etched to form the insulating layer.

It is preferable that, in the device portion forming step, each of the convex portion be entirely etched with a width of 3.0 µm or less from an outer edge of a corresponding one of the conductive films when viewed from a direction normal to a surface of the substrate layer.

It is preferable that, in the device portion forming step, after the convex portions are etched so that a part of each convex portion is left with a width of 3.0 µm or less in a direction perpendicular to an outer edge of a corresponding one of the conductive films when viewed from a direction normal to a surface of the substrate layer, a surface of the base layer be planarized to remove the part of each convex portion which is left in the base layer.

The peel-off material may contain at least one of hydrogen and an inert gas element.

The substrate layer may contain at least one semiconductor selected from the group consisting of group IV semiconductors, group II-VI compound semiconductors, group III-V compound semiconductors, group IV-IV compound semiconductors, alloys containing homologous elements thereof, and oxide semiconductors.

The substrate may be a glass substrate or a semiconductor substrate.

The plurality of conductive films may be made of a metal material.

The metal material may be at least one of TiN, TaN, HfN, ZrN, NbN, W, Mo, Ti, Ta, Co, Ni, Pt, Cu, Ag, and Au.

Moreover, a semiconductor device according to the present invention includes: a substrate; and a device portion, wherein the semiconductor device is formed by bonding the device portion with the substrate, where the device portion has a device formed on a substrate layer, a first planarizing layer covering at least a part of the device, a plurality of conductive films formed adjacent to each other on a surface of the first planarizing layer, and a second planarizing layer covering the plurality of conductive films, the device portion further has a planarization assisting layer, which covers the plurality of conductive films, between the first planarizing layer and the second planarizing layer, and a height of the planarization assisting layer from a surface of the first planarizing layer located on a side opposite to the substrate layer is equal between at least a part of a region where the conductive films are formed, and at least a part of a region where no conductive film is formed.

Moreover, a semiconductor device according to the present invention includes: a substrate; and a device portion, wherein the semiconductor device is formed by bonding the device portion with the substrate, where the device portion has a device formed on a substrate layer, a planarizing layer covering at least a part of the device, a plurality of conductive films formed adjacent to each other on a surface of the planarizing layer, and an insulating layer covering the plurality of conductive films, wherein a height of the insulating layer from a surface of the planarizing layer located on a side opposite to the substrate layer is equal between an entire region where the conductive films are formed, and at least a part of a region where no conductive film is formed, and is the highest in the region where the conductive films are formed.

Grooves, each extending along an outer edge of a corresponding one of the conductive films in at least a part of an outer periphery of the conductive film, may be formed in the planarization assisting layer.

Grooves, each extending along an outer edge of a corresponding one of the conductive films in at least a part of an outer periphery of the conductive film, may be formed in the insulating layer.

It is preferable that each of the grooves be formed in a region of 3.0 µm or less from the outer edge of the conductive film when viewed from a direction normal to a surface of the substrate layer.

A part of each of convex portions, which reflect a difference in level between the surface of the first planarizing layer and surfaces of the conductive films, may be formed in the planarization assisting layer.

It is preferable that the part of each convex portion be formed with a width of 3.0 µm or less in a direction perpendicular to an outer edge of a corresponding one of the conductive films when viewed from a direction normal to a surface of the substrate layer.

The peel-off material may contain at least one of hydrogen and an inert gas element.

The substrate layer may contain at least one semiconductor selected from the group consisting of group IV semiconductors, group II-VI compound semiconductors, group III-V compound semiconductors, group IV-IV compound semiconductors, alloys containing homologous elements thereof, and oxide semiconductors.

The substrate may be a glass substrate or a semiconductor substrate.

The plurality of conductive films may be made of a metal material.

The metal material may be at least one of TiN, TaN, HfN, ZrN, NbN, W, Mo, Ti, Ta, Co, Ni, Pt, Cu, Ag, and Au.

The device portion may have a MIS transistor.

[Functions]

Functions of the present invention will be described below.

A semiconductor device is formed by bonding a device portion with a substrate, where the device portion has a device formed on a substrate layer, a first planarizing layer covering at least a part of the device, a plurality of conductive films formed adjacent to each other on the surface of the first planarizing layer, and a second planarizing layer covering the plurality of conductive films. The device portion further has a planarization assisting layer, which covers the plurality of conductive films, between the first planarizing layer and the second planarizing layer The planarization assisting layer is formed so that the height of the planarization assisting layer from the surface of the first planarizing layer located on the side opposite to the substrate layer is equal between at least a part of a region where the conductive films are formed, and at least a part of a region where no conductive film is formed.

Moreover, a semiconductor device is formed by bonding a device portion with a substrate, where the device portion has a device formed on a substrate layer, a planarizing layer covering at least a part of the device, a plurality of conductive films formed adjacent to each other on a surface of the planarizing layer, and an insulating layer covering the plurality of conductive films. The height of the insulating layer from the surface of the planarizing layer located on the side opposite to the substrate layer is equal between an entire region where the conductive films are formed, and at least a part of a region where no conductive film is formed, and is the highest in the region where the conductive films are formed. A device portion forming step, a peel-off layer forming step, a bonding step, and a separating step are performed in order to manufacture these semiconductor devices.

In the device portion forming step, the device portion is formed on the substrate layer. An example of the device included in the device portion is a thin film transistor, such as a MIS (Metal Insulator Semiconductor) transistor. It is preferable that the substrate layer contain, e.g., at least one semiconductor selected from the group consisting of group IV semiconductors, group II-VI compound semiconductors, group III-V compound semiconductors, group IV-IV compound semiconductors, alloys containing homologous elements thereof, and oxide semiconductors.

The plurality of conductive films may be made of a metal material, where at least one of TiN, TaN, HfN, ZrN, NbN, W, Mo, Ti, Ta, Co, Ni, Pt, Cu, Ag, and Au may be used as the metal material.

In the peel-off layer forming step, a peel-off layer is formed by ion implanting a peel-off material to the substrate layer. A material containing at least one of hydrogen and an inert gas element can be used as the peel-off material for the substrate layer. The peel-off layer is formed inside the substrate layer in this manner.

Thereafter, in the bonding step, the device portion is bonded with the substrate. A glass substrate or a semiconductor substrate can be used as the substrate. For example, in the case of using a glass substrate as the substrate, the substrate is transparent, and thus, the semiconductor device can be applied to display devices such as LCD devices.

Then, in the separating step, a part of the substrate layer is separated and removed along the peel-off layer by, e.g., a heat treatment or the like. The thickness of the substrate layer is reduced in this manner. Thus, the operating speed of the device can be improved, and the parasitic capacitance thereof can be reduced.

Incidentally, the difference in height, which reflects the difference in level between the surface of the planarizing layer that covers at least a part of the device, and the surfaces of the conductive films, can remain in the bonding surface of the device portion. As a result, defective bonding occurs between the device portion and the substrate, hindering reliable bonding of the device portion with the substrate.

Thus, in the present invention, in the device portion forming step, an assisting layer forming step of forming a planarization assisting layer, which covers the plurality of conductive films, over the first planarizing layer is performed before forming the second planarizing layer. In this assisting layer forming step, the planarization assisting layer is formed so that the height of the planarization assisting layer from the surface of the first planarizing layer located on the side opposite to the substrate layer becomes equal between at least a part of the region where the conductive films are formed, and at least a part of the region where no conductive film is formed. This prevents the difference in level between the surface of the first planarizing surface and the surfaces of the conductive films from being reflected on the second planarizing layer, and thus, prevents the difference in height from remaining in the bonding surface of the device portion. As a result, the device portion having the plurality of conductive films can be reduced in thickness, and reliably bonded with the substrate.

In the assisting layer forming step, the planarization assisting layer can be formed by forming a base layer, which covers the plurality of conductive films, over the first planarizing layer, and then, at least partially etching convex portions, which are formed in the base layer so as to reflect the difference in level between the surface of the first planarizing layer and the surfaces of the conductive films.

That is, in this assisting layer forming step, the planarization assisting layer may be formed by entirely etching the convex portions. Especially, in the case of etching each of the convex portions with a width of 3.0 µm or less from the outer edge of a corresponding one of the conductive films when viewed from the direction normal to the surface of the substrate layer, even if grooves, each extending along the outer edge of a corresponding one of the conductive films in at least a part of the outer periphery of the conductive film, are formed in the planarization assisting layer, each of the grooves is formed in a region of 3.0 µm or less from the outer edge of a corresponding conductive film when viewed from the direction normal to the surface of the substrate layer, and thus, the groove width is sufficiently small. Thus, the grooves can be embedded by the second planarizing layer, and the bonding surface of the device portion can be sufficiently planarized.

Alternatively, in the assisting layer forming step, the planarization assisting layer may be formed by partially etching the convex portions. Especially, in the case of etching the convex portions so that a part of each convex portion is left with a width of 3.0 µm or less in the direction perpendicular to the outer edge of a corresponding one of the conductive films when viewed from the direction normal to the surface of the substrate layer, the part of each convex portion, which is left in the planarization assisting layer, has a sufficiently small width of 3.0 µm or less. Thus, the surface of the device portion can be sufficiently planarized by the second planarizing layer.

Moreover, in the present invention, in the device portion forming step, the insulating layer is formed so that the height of the insulating layer from the surface of the planarizing layer located on the side opposite to the substrate layer becomes equal between the entire region where the conductive films are formed, and at least a part of the region where no conductive film is formed, and becomes the highest in the region where the conductive films are formed. This prevents the difference in height from remaining in the bonding surface of the device portion. As a result, the device portion having the plurality of conductive films can be reduced in thickness, and reliably bonded with the substrate. Thus, the step of further laminating a planarizing layer on the insulating layer that covers the plurality of conductive films can be omitted, whereby an increase in the number of steps can be prevented.

In the device portion forming step, the insulating layer can be formed by forming a base layer, which covers the plurality of conductive films, over the planarizing layer, and then, at least partially etching convex portions, which are formed in the base layer so as to reflect the difference in level between the surface of the planarizing layer and the surfaces of the conductive films.

That is, in the device portion forming step, the insulating layer may be formed by entirely etching the convex portions. Especially, in the case of etching each of the convex portions with a width of 3.0 µm or less from the outer edge of a corresponding one of the conductive films when viewed from the direction normal to the surface of the substrate layer, even if grooves, each extending along the outer edge of a corresponding one of the conductive films in at least a part of the outer periphery of the conductive film, are formed in the insulating layer, each of the grooves is formed in a region of 3.0 μm or less from the outer edge of a corresponding conductive film, and thus, the groove width is sufficiently small. Thus, the device portion can be reliably bonded with the substrate even if the grooves still remain when later performing the bonding step. Moreover, these grooves can be removed by planarizing the surface of the insulating layer by a CMP method or the like.

Alternatively, in the device portion forming step, the insulating film may be formed by partially etching the convex portions, and then, removing the convex portions left in the base layer to planarize the surface of the base layer. Especially, in the case of etching the convex portions so that a part of each convex portion is left with a width of 3.0 μm or less in the direction perpendicular to the outer edge of a corresponding one of the conductive films when viewed from the direction normal to the surface of the substrate layer, and then, planarizing the surface of the base layer to remove the part of each convex portion left in the base layer, the part of each convex portion, which is left on the base layer before the planarization process, has a sufficiently small width, and thus, the part of each convex portion can be reliably removed by the planarization process such as a CMP process, whereby the surface of the insulating layer can be planarized.

Effects of the Invention

According to the present invention, a planarization assisting layer is formed so that the height of the planarization assisting layer from the surface of a first planarizing layer becomes equal at least partially between a region where conductive films are formed, and a region where no conductive film is formed. Thus, the difference in level between the surface of the first planarizing layer and the surfaces of the conductive films can be prevented from being reflected on a second planarizing layer. Thus, the difference in height can be prevented from remaining in a bonding surface of a device portion, whereby the device portion having the plurality of conductive films can be reduced in thickness, and reliably bonded with a substrate.

Figure 1:
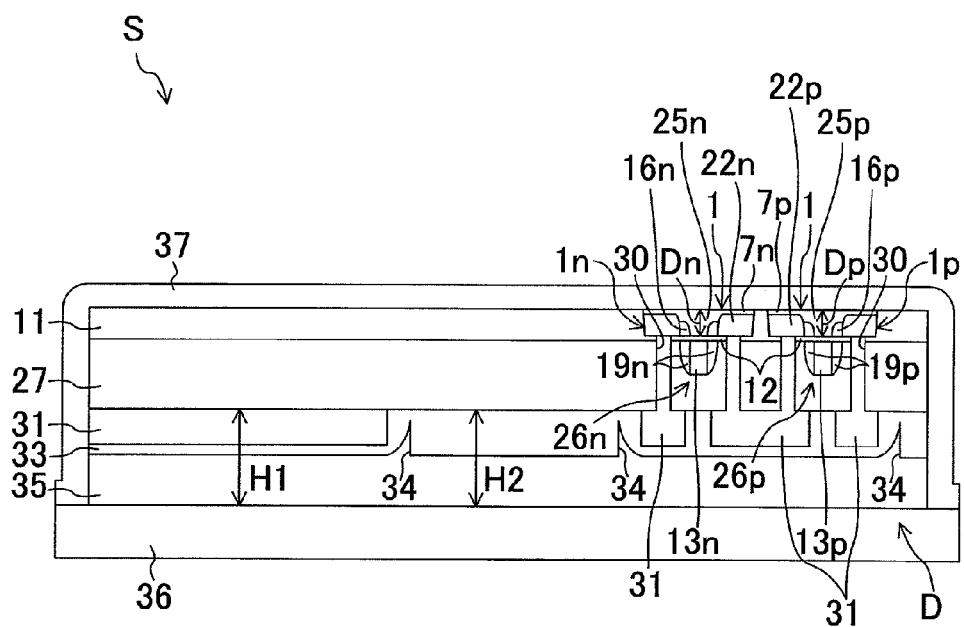
FIG. 1 is a cross-sectional view schematically showing the structure of a main part of a semiconductor device of a first embodiment.

DESCRIPTION OF CHARACTERS (S) semiconductor device
(D) device portion
(w) width of a convex portion
(1) silicon substrate (a substrate layer)
(26p) PMOS transistor (a device)
(26n) NMOS transistor (a device)
(27) first planarizing layer (a planarizing layer)
(28) peel-off layer
(31) conductive film
(32) base layer of a planarization assisting layer
(33) planarization assisting layer
(35) second planarizing layer
(36) glass substrate (a substrate)
(40, 45, 51) convex portion
(41, 55) part of a convex portion
(50) base layer of a planarization assisting layer
(54) planarizing insulating layer (an insulating layer)

BEST MODE FOR CARRYING OUT THE INVENTION

Embodiments of the present invention will be described in detail below with reference to the accompanying drawings. Note that the present invention is not limited to the following embodiments.

First Embodiment

Figure 2:
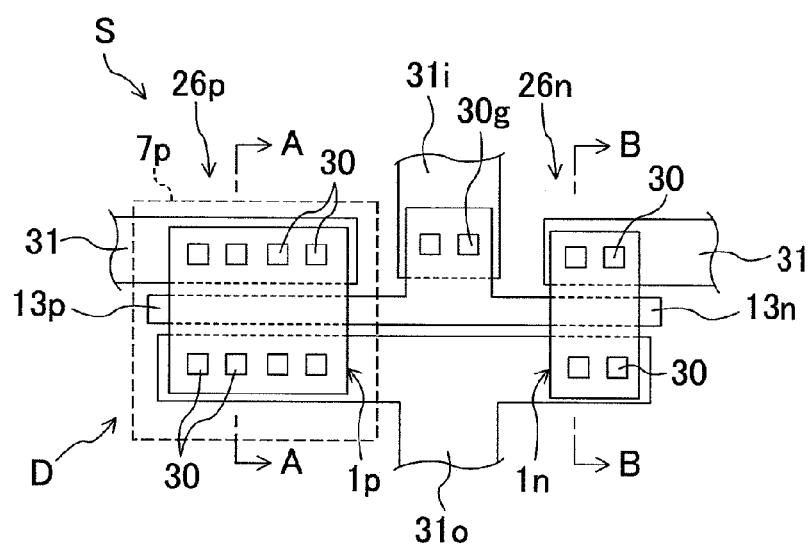
FIG. 2 is a plan view schematically showing the main part of the semiconductor device of the first embodiment.

FIGS. 1 through 25 show a first embodiment of the present invention. FIG. 1 is a cross-sectional view schematically showing the structure of a main part of a semiconductor device S. FIG. 2 is a plan view schematically showing the main part of the semiconductor device S. FIGS. 3 through 25 are cross-sectional views schematically showing manufacturing steps of the semiconductor device S.

The semiconductor device S is directly formed on the glass substrate 36, which is, for example, a substrate of a display panel of an LCD device, not shown in the figure, and can be used as a driver for controlling driving of a plurality of pixels of the display panel, a power supply circuit, a memory circuit, a central processing circuit, or the like.

As shown in FIG. 1, the semiconductor device S includes a glass substrate 36, and a device portion D bonded with the glass substrate 36, and formed at a high density and with high accuracy. That is, the semiconductor device S is formed by bonding the device portion D with the glass substrate 36 by self bonding.

Note that, in the case of applying the semiconductor device S to LCD devices for providing transmissive display, it is preferable that the substrate 36 be a transparent substrate such as a glass substrate. However, in the case of applying the semiconductor device S to other display devices and the like, other substrates such as a semiconductor substrate may be used as the substrate 36.

The device portion D includes: transistors 26p, 26n, which are devices formed in a substrate layer 1; a first planarizing layer 27 that partially covers the transistors 26p, 26n; a plurality of conductive films 31 formed adjacent to each other on the surface of the first planarizing layer 27; and a second planarizing layer 35 that covers the plurality of conductive films 31. Moreover, the device portion D is bonded with the glass substrate 36 by using the surface of the second planarizing layer 35 as a bonding surface. This device portion D will be described in detail below.

As shown in FIGS. 1 and 2, the device portion D has a PMOS transistor 26p and an NMOS transistor 26n, which are MIS (Metal-Insulator-Semiconductor) transistors. Moreover, as shown in FIG. 1, an element isolation layer 11 is formed as an element isolation region for electrically isolating the transistors 26p, 26n from each other.

The transistor (the PMOS transistor) 26p on the right side of FIG. 1 is herein schematically shown in cross section taken along line A-A in FIG. 2. On the other hand, the transistor (the NMOS transistor) 26n on the left side of FIG. 1 is schematically shown in cross section taken along line B-B in FIG. 2.

Note that, although FIGS. 1 and 2 show one PMOS transistor 26p and one NMOS transistor 26n, devices to be formed are not limited to these, and the present invention is applicable to any semiconductor devices. Moreover, any number of devices can be formed in the range of one to several millions.

As shown in FIG. 1, the second planarizing layer 35 as an insulating layer is laminated on the surface of the glass substrate 36. The first planarizing layer 27 is laminated over the second planarizing layer 35, and the plurality of conductive films 31 are formed on the surface on the second planarizing layer 35 side of the first planarizing layer 27.

Moreover, the device portion D has a planarization assisting layer 33, which covers the plurality of conductive films 31, between the first planarizing layer 27 and the second planarizing layer 35. The height of the planarization assisting layer 33 from the surface of the first planarizing layer 27 located on the side opposite to the substrate layer 1 is equal between the entire region where the conductive films 31 are formed, and a part of a region where no conductive film 31 is formed.

That is, the planarization assisting layer 33 fills, in some regions, the difference in level between the surface of the first planarizing layer 27 and the surfaces of the conductive films 31, so that the surface level from the surface of the first planarizing layer 27 becomes equal between the entire surface on the glass substrate 36 side of the planarization assisting layer 33 formed on the first planarizing layer 27 with the conductive films 31 interposed therebetween, and a part of the surface on the glass substrate 36 side of the planarization assisting layer 33 formed directly on the first planarizing layer 27. Thus, the gap between the first planarizing layer 27 and the second planarizing layer 35 becomes equal between the entire region where the conductive films 31 are formed, and a part of the region where no conductive film 31 is formed.

Grooves 34, each extending along the outer edge of a corresponding one of the conductive films 31 in at least a part of the outer periphery of the conductive film 31, are formed in the planarization assisting layer 33. Each groove 34 is formed in a region of 3.0 μm or less from the outer edge of a corresponding conductive film 31 when viewed from the direction normal to the surface of the substrate layer 1. The grooves 34 are filled with an insulating material of the second planarizing layer 35. Thus, a height H1 of the second planarizing layer 35 from the surface of the first planarizing layer 27 located on the side opposite to the substrate layer 1, in the region where the conductive films 31 are formed, is equal to a height H2 of the second planarizing layer 35 from the surface of the first planarizing layer 27 located on the side opposite to the substrate layer 1, in the region where no conductive film 31 is formed.

The element isolation layer 11 and a gate oxide film 12 are formed on the first planarizing layer 27. Gate electrodes 13p, 13n, which are made of, e.g., polysilicon or the like, and sidewalls 19p, 19n are formed between the first planarizing layer 27 and the gate oxide film 12. The sidewalls 19p, 19n are positioned on both left and right sides of the respective gate electrodes 13p, 13n in the figure. The substrate layer 1 is formed on the gate oxide film 12. The substrate layer 1 is a semiconductor layer, such as, e.g., a monocrystalline silicon semiconductor.

Note that, in addition to the monocrystalline silicon semiconductor, the substrate layer 1 may contain at least one semiconductor selected from the group consisting of group IV semiconductors, group II-VI compound semiconductors, group III-V compound semiconductors, group IV-IV compound semiconductors, alloys containing homologous elements thereof, and oxide semiconductors.

As described below, a part of the substrate layer 1 is separated and removed along a peel-off layer 28 formed by ion implantation of a peel-off material such as hydrogen. This peel-off material contains at least one of hydrogen and an inert gas element. Thus, the thickness of the substrate layer 1 is reduced by separating and removing a part of the substrate layer 1 by a heat treatment.

The substrate layer 1 has a P-well region 7p and an N-well region 7n, where a first active region 1p is formed in the P-well region 7p, and a second active region 1n is formed in the N-well region 7n. The first active region 1p forms the PMOS transistor 26p, while the second active region 1n forms the NMOS transistor 26n. The first active region 1p and the second active region 1n are covered by a protective film 37 for protecting the surfaces thereof.

Each active region 1p, 1n has an LDD (Lightly Doped Drain) structure that is respectively formed by a channel region 25p, 25n facing the gate electrode 13p, 13n with the gate oxide film 12 interposed therebetween, lightly doped impurity regions 16p, 16n formed on both left and right sides of the channel region 25p, 25n in the figure, and heavily doped impurity regions 22p, 22n formed outside the lightly doped impurity regions 16p, 16n and functioning as a source region or a drain region. The lightly doped impurity regions 16p, 16n face the sidewalls 19p, 19n with the gate oxide film 12 interposed therebetween.

That is, the P-well region 7p, which forms the channel region 25p, is formed in the first active region 1p, and also, the P-type lightly doped impurity regions 16p positioned on both left and right sides of the channel region 25p in the figure, and the P-type heavily doped impurity regions 22p positioned outside the P-type lightly doped impurity regions 16p are formed in the first active region 1p. On the other hand, the N-well region 7n, which forms the channel region 25n, is formed in the second active region 1n, and also, the N-type lightly doped impurity regions 16n positioned on both left and right sides of the channel region 25n in the figure, and the N-type heavily doped impurity regions 22n positioned outside the N-type lightly doped impurity regions 16n are formed in the second active region 1n.

Since the heavily doped impurity regions 22p, 22n and the lightly doped impurity regions 16p, 16n are formed by self alignment, the end faces of the heavily doped impurity regions 22p, 22n are respectively positioned in a self-aligned manner with respect to the end faces of the sidewalls 19p, 19n. The end faces of the lightly doped impurity regions 16p, 16n are respectively positioned in a self-aligned manner with respect to the end faces of the gate electrodes 13p, 13n. Moreover, a thickness Dp of the channel region 25p of the PMOS transistor 26p and a thickness Dn of the channel region 25n of the NMOS transistor 26n are equal to each other.

Contact holes 30 are formed so as to extend through the first planarizing layer 27 and the gate oxide film 12, at positions that overlap the heavily doped impurity regions 22p, 22n. Each contact hole 30 is filled with a conductive material. Moreover, the plurality of conductive films 31, including source electrodes and drain electrodes formed on the contact holes 30, are formed between the first planarizing layer 27 and the planarization assisting layer 33. The conductive films 31 are made of a metal material. For example, at least one metal material of refractory metal materials, such as TiN, TaN, MN, ZrN, NbN, W, and Mo, and transition metal materials having a melting point of 1,000° C. or higher, such as Ti, Ta, Co, Ni, Pt, Cu, Ag, and Au, can be used as the metal material.

Thus, the device portion D in the semiconductor device S of the first embodiment has a CMOS (Complementary Metal Oxide Semiconductor) structure. That is, as shown in FIG. 2, the PMOS transistor 26p and the NMOS transistor 26n are connected in series with each other. Moreover, a conductive film 31i, to which an input voltage is applied, is electrically connected to the gate electrode 13p of the PMOS transistor 26p and the gate electrode 13n of the NMOS transistor 26n through contact holes 30g. Moreover, the heavily doped impurity regions 22p, 22n, which respectively function as the drain regions of the PMOS transistor 26p and the NMOS transistor 26n, are electrically connected to a conductive film 31o, from which an output voltage is obtained.

[Manufacturing Method]

A manufacturing method of the semiconductor device S will be described below.

The manufacturing method of the semiconductor device S includes a device portion forming step, a peel-off layer forming step, a bonding step, and a separating step.

In the device portion forming step, a device portion D is formed, where the device portion D has a PMOS transistor 26p and an NMOS transistor 26n which are fainted in a substrate layer 1, a first planarizing layer 27 that partially covers the transistors 26p, 26n, a plurality of conductive films 31 that are formed adjacent to each other on the surface of the first planarizing layer 27, and a second planarizing layer 35 that covers the plurality of conductive films 31.

Figure 3:
FIG. 3 is a cross-sectional view showing a thermal oxide film formed on a silicon substrate.

That is, first, as shown in FIG. 3, a thermal oxide film 2 having a thickness of about 30 nm is formed on a silicon substrate 1 (corresponding to the substrate layer 1), which is a wafer made of a monocrystalline silicon semiconductor. Although the thermal oxide film 2 is intended to prevent contamination of the surface of the silicon substrate 1 in an ion implantation process that is to be performed later, the thermal oxide film 2 need not necessarily be formed.

Although the silicon substrate 1, made of a monocrystalline silicon semiconductor, is described herein as an example of the substrate layer 1, the present invention is not limited to this, and the silicon substrate 1 may be made of a material containing other semiconductor or the like. That is, the substrate layer 1 may contain at least one semiconductor selected from the group consisting of group IV semiconductors, group II-VI compound semiconductors, group III-V compound semiconductors, group IV-IV compound semiconductors, alloys containing homologous elements thereof, and oxide semiconductors.

Figure 4:
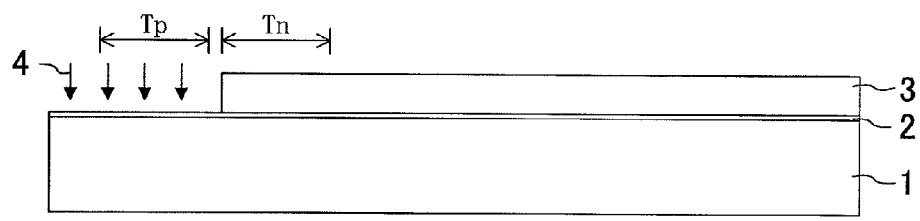
FIG. 4 is a cross-sectional view illustrating the step of ion implanting phosphorus to the silicon substrate.

Then, as shown in FIG. 4, a resist layer 3 is formed so as to expose a region Tp where the PMOS transistor 26p is to be formed (hereinafter referred to as the "PMOS region"), whereby a region Tn where the NMOS transistor 26n is to be formed (hereinafter referred to as the "NMOS region") is covered by the resist layer 3. Then, an N-type impurity element (e.g., phosphorus or the like) is ion implanted into the PMOS region Tp by using the resist layer 3 as a mask. Arrows 4 in FIG. 4 indicate the implanting direction of the N-type impurity element. In the case of ion implanting phosphorus, the implantation energy is between about 30 KeV and about 150 KeV, and the dose is between about $1 \times 10^{12}$ cm$^{-2}$ and about $1 \times 10^{13}$ cm$^{-2}$. At this time, in the case of implanting a P-type impurity element to the whole surface of the silicon substrate 1 in the next step, the dose of the N-type impurity element is increased to, e.g., about $2 \times 10^{12}$ cm$^{-2}$ to about $2 \times 10^{13}$ cm$^{-2}$ in view of the amount of N-type impurity element that is cancelled by the P-type impurity element.

Figure 5:
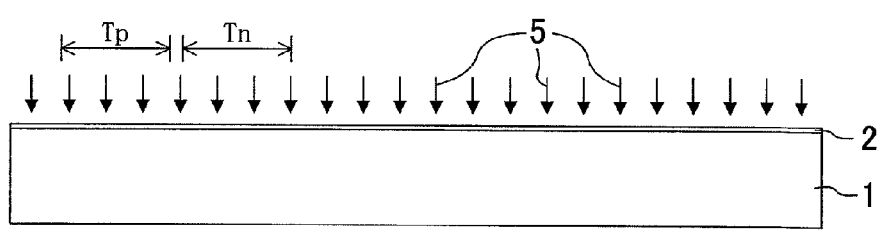
FIG. 5 is a cross-sectional view illustrating the step of ion implanting boron to the silicon substrate.

Next, as shown in FIG. 5, after the resist layer 3 is removed, a P-type impurity element (e.g., boron or the like) is simultaneously ion implanted into both the PMOS region Tp and the NMOS region Tn. Arrows 5 in FIG. 5 indicate the implanting direction of the P-type impurity element. In the case of ion implanting boron, the implantation energy is between about 10 KeV and about 50 KeV, and the dose is between about $1 \times 10^{12}$ cm$^{-2}$ and about $1 \times 10^{13}$ cm$^{-2}$.

Figure 6:
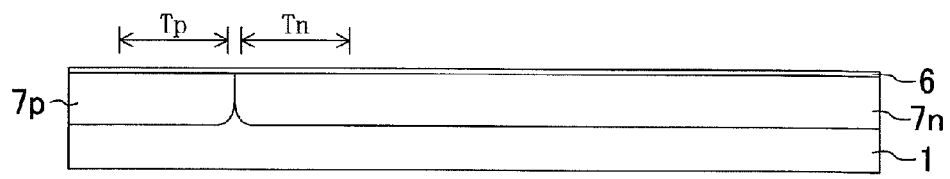
FIG. 6 is a cross-sectional view showing a state where the thermal oxide film, a P-well region, and an N-well region are formed.

Then, after the thermal oxide film 2 is removed, as shown in FIG. 6, a heat treatment is performed at about 900° C. to about 1,000° C. in an oxidizing atmosphere to form a thermal oxide film 6 having a thickness of about 30 nm on the surface of the silicon substrate 1, and also, the impurity elements implanted in the PMOS region Tp and the NMOS region Tn are diffused to form a P-well region 7p and an N-well region 7n.

Note that, as described above, in the case of implanting boron as a P-type impurity element after implanting phosphorus as an N-type impurity element, since phosphorus has a smaller diffusion coefficient in silicon than that of boron in a heat treatment, a heat treatment may be performed before implanting boron, so that phosphorus is appropriately diffused in the silicon substrate 1 in advance. Moreover, when it is desired to avoid cancellation of the N-type impurity element by the P-type impurity element in the PMOS region Tp, a resist layer may first be formed on the PMOS region Tp, and then, the P-type impurity element may be implanted into the NMOS region Tn by using the resist layer as a mask. In this case, cancellation by the P-type impurity element need not be considered when implanting the N-type impurity element into the PMOS region Tp.

Moreover, the conductivity types of impurity elements to be implanted into the PMOS region Tp and the NMOS region Tn can be set as appropriate. For example, a P-type impurity element may be implanted into the PMOS region Tp, and an N-type impurity element may be implanted into the PMOS region Tp and the NMOS region Tn. Moreover, the order of implanting impurity elements into the PMOS region Tp and the NMOS region Tn can be set as appropriate. For example, an N-type impurity element may first be implanted into the PMOS region Tp and the NMOS region Tn, and then, an N-type impurity element may be implanted only into the NMOS region Tn.

Figure 7:
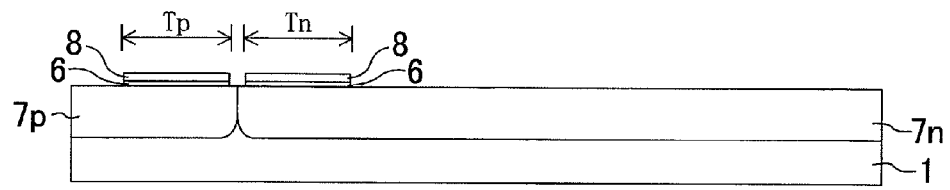
FIG. 7 is a cross-sectional view showing a patterned thermal oxide film and a patterned silicon nitride film.

Next, a silicon nitride film 8 having a thickness of about 200 nm is formed on the surface of the silicon substrate (the P-well region 7p and the N-well region 7n) 1 by a CVD (Chemical Vapor Deposition) method or the like, and then, as shown in FIG. 7, the thermal oxide film 6 and the silicon nitride film 8 are patterned.

At this time, the P-well region 7p and the N-well region 7n are partially covered by the thermal oxide film 6 and the silicon nitride film 8. Moreover, a portion including the boundary between the P-well region 7p and the N-well region 7n is exposed. Thus, a PMOS transistor 26p and an NMOS transistor 26n are respectively formed later in the regions where the thermal oxide film 6 and the silicon nitride film 8 are left.

Figure 8:
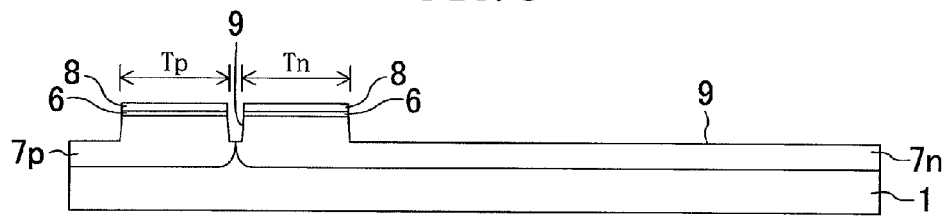
FIG. 8 is a cross-sectional view showing a state where a trench is formed.

Then, as shown in FIG. 8, by using the silicon nitride film 8 as a mask, the silicon substrate 1 is etched by a depth of about 200 nm to about 500 nm by a dry etching method such as RIE (Reactive Ion Etching) to form a shallow trench 9.

Figure 9:
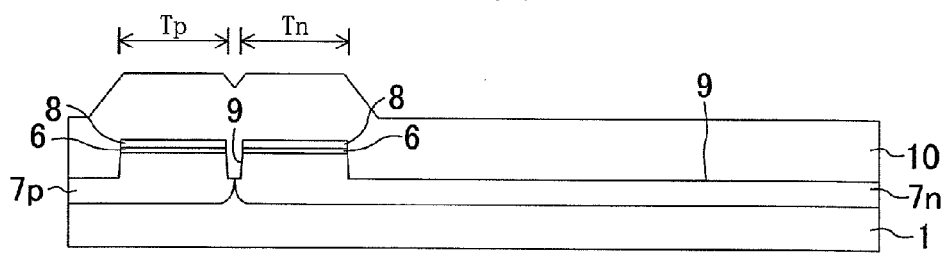
FIG. 9 is a cross-sectional view showing a state where an insulating layer is formed so as to embed a trench.

Then, the PMOS transistor 26p and the NMOS transistor 26n, which are to be formed later, are isolated from each other by an STI (Shallow Trench Isolation) method. First, by using the silicon nitride film 8 as a mask, a heat treatment is performed at a temperature of about 850° C. to about 1,000° C. in an oxygen atmosphere to form an oxide film (not shown) having a thickness of about 20 nm on the surface of the trench 9. Then, as shown in FIG. 9, a thick insulating layer (an oxide layer) 10 is deposited on the whole surface of the silicon substrate 1 by a CVD method or the like to embed the trench 9.

Figure 10:
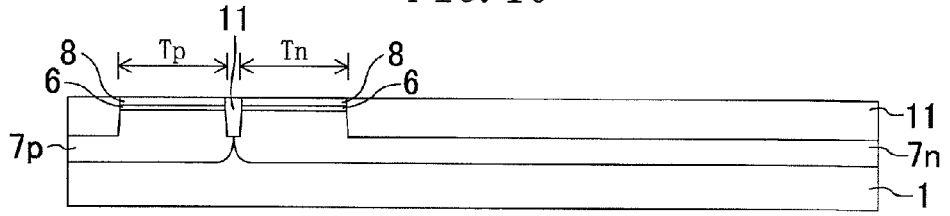
FIG. 10 is a cross-sectional view showing a state where an element isolation layer is formed.

Then, as shown in FIG. 10, the insulating layer 10 is planarized by a CMP (Chemical Mechanical Polishing) method by using the silicon nitride film 8 as an etching stopper, thereby forming an element isolation layer 11 on the surface of the trench 9. Note that, although the STI method is an element isolation method, element isolation may be performed by a method other than the STI method, such as, e.g., LOCOS (Local Oxidation of Silicon) oxidation, or the like.

Figure 11:
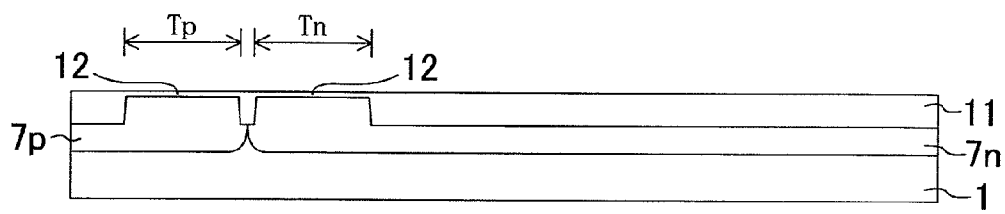
FIG. 11 is a cross-sectional view showing a state where a gate oxide film is formed.

Then, after removing the thermal oxide film 6 and the silicon nitride film 8, a heat treatment is performed at a temperature of about 1,000° C. in an oxygen atmosphere, whereby, as shown in FIG. 11, a gate oxide film 12, which is a thermal oxide film, is formed with a thickness of about 10 nm to about 20 nm on the surface of the P-well region 7p and the N-well region 7n.

Note that, after removing the silicon nitride film 8, a P-type impurity element or an N-type impurity element may be ion implanted into at least one of the P-well region 7p and the N-well region 7n in order to adjust the threshold voltage of the PMOS transistor 26p and the NMOS transistor 26n. The impurity concentration of channel regions 25p, 25n is eventually set as appropriate in the range of about $1 \times 10^{15}$ cm$^{-3}$ to about $1 \times 10^{18}$ cm$^{-3}$ in order to control the threshold voltage.

Figure 12:
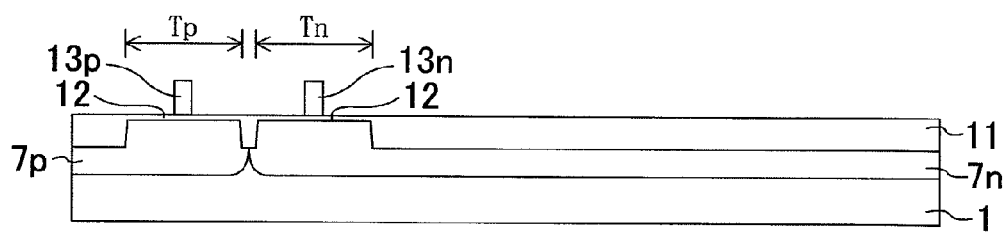
FIG. 12 is a cross-sectional view showing a state where gate electrodes are formed.

Then, as shown in FIG. 12, gate electrodes 13p, 13n are respectively formed on the P-well region 7p and the N-well region 7n with the gate oxide film 12 interposed therebetween. That is, a polysilicon layer is first deposited with a thickness of about 300 nm on the surface of the gate oxide film 12 by, e.g., a CVD method or the like, and then, an N-type impurity element, such as phosphorus, is introduced into the polysilicon layer by thermal diffusion or the like in order to reduce the resistance of the polysilicon layer, thereby forming an N+ polysilicon layer. In the case of introducing the N-type impurity element by thermal diffusion, the thermal diffusion is performed at a temperature of about 900° C. to about 1,000° C. by using, e.g., POCl$_3$ or the like as a source gas. Then, the N+ polysilicon layer is patterned by photolithography or the like to form the gate electrodes 13p, 13n. Note that techniques, such as ion implantation and silicide, may be combined as a method for reducing the resistance of the gate electrodes 13p, 13n.

Figure 13:
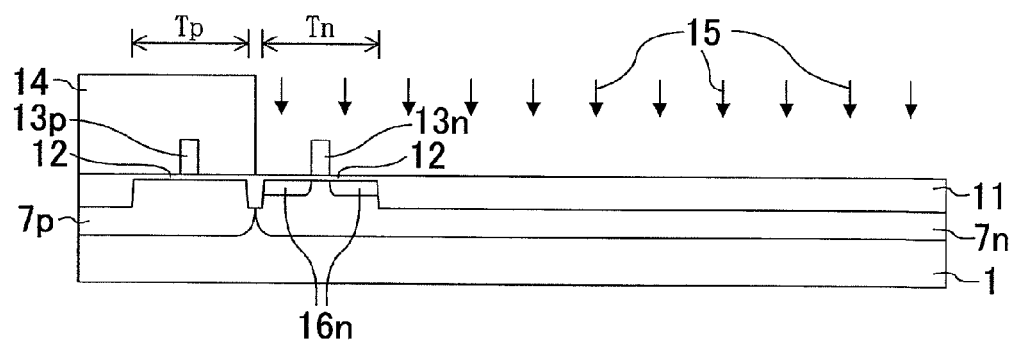
FIG. 13 is a cross-sectional view illustrating the step of forming lightly doped impurity regions in the N-well region.

Then, as shown in FIG. 13, a resist layer 14 is formed so as to expose the NMOS region Tn, whereby the PMOS region Tp is covered by the resist layer 14. Then, an N-type impurity element is ion implanted into the N-well region 7n by using the resist layer 14 and the gate electrode 13n as a mask. Arrows 15 in FIG. 13 indicate the implanting direction of the N-type impurity element. Thus, N-type lightly doped impurity regions 16n are formed in the silicon substrate 1. For example, phosphorus is used as the N-type impurity element, and the ion implantation is performed at, e.g., an implantation energy of about 10 KeV to about 50 KeV, and a dose of about $5 \times 10^{12}$ cm$^{-2}$ to about $1 \times 10^{14}$ cm$^{-2}$.

At this time, as a measure against the short channel effect, boron may be implanted into the channel region 25n, located adjacent to heavily doped impurity regions (a source region and a drain region) 22n that are to be formed later, by so-called halo implantation by oblique implantation and rotational implantation, or the like by using the gate electrode 13n as a mask. Then, the resist layer 14 is removed.

Figure 14:
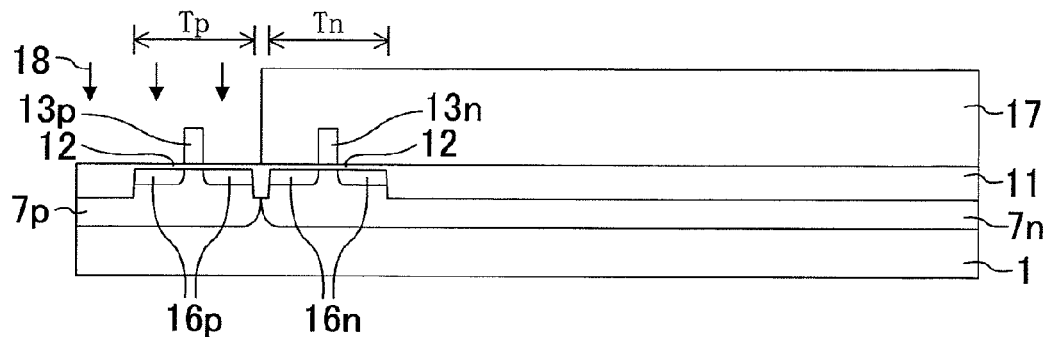
FIG. 14 is a cross-sectional view illustrating the step of forming lightly doped impurity regions in the P-well region.

Then, as shown in FIG. 14, a resist layer 17 is formed so as to expose the PMOS region Tp, whereby the NMOS region Tn is covered by the resist layer 17. Then, a P-type impurity element is ion implanted into the P-well region 7p by using the resist layer 17 and the gate electrode 13p as a mask. Arrows 18 in FIG. 14 indicate the implanting direction of the P-type impurity element. Thus, P-type lightly doped impurity regions 16p are formed in the silicon substrate 1. For example, boron is used as the P-type impurity element, and in the case where the ion species is, e.g., BF2, the ion implantation is performed at an implantation energy of about 10 KeV to about 50 KeV, and a dose of about $5 \times 10^{12}$ cm$^{-2}$ to about $1 \times 10^{14}$ cm$^{-2}$. Then, the resist film 17 is removed.

Note that, since boron has a relatively large thermal diffusion coefficient, the P-type lightly doped impurity regions 16p of the PMOS transistor 26p can, in some cases, be formed in a later step only by thermal diffusion of boron implanted when forming P-type heavily doped impurity regions 22p of the PMOS transistor 26p. Thus, the ion implantation for forming the P-type lightly doped impurity regions 16p need not necessarily be performed. In this case, the step of forming the resist layer 17 can be omitted, whereby the number of steps can be reduced.

Figure 15:
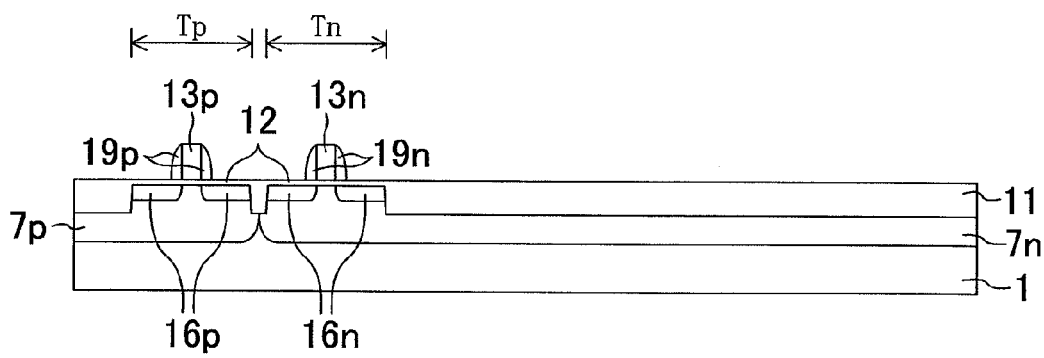
FIG. 15 is a cross-sectional view showing a state where sidewalls are formed.

Then, a SiO$_2$ layer is formed by a CVD method or the like so as to cover the element isolation layer 11, the gate oxide film 12, and the like. Then, the SiO$_2$ layer is subject to anisotropic dry etching to form sidewalls 19p, 19n, made of SiO$_2$, on both sidewalls of the gate electrodes 13p, 13n, as shown in FIG. 15.

Figure 16:
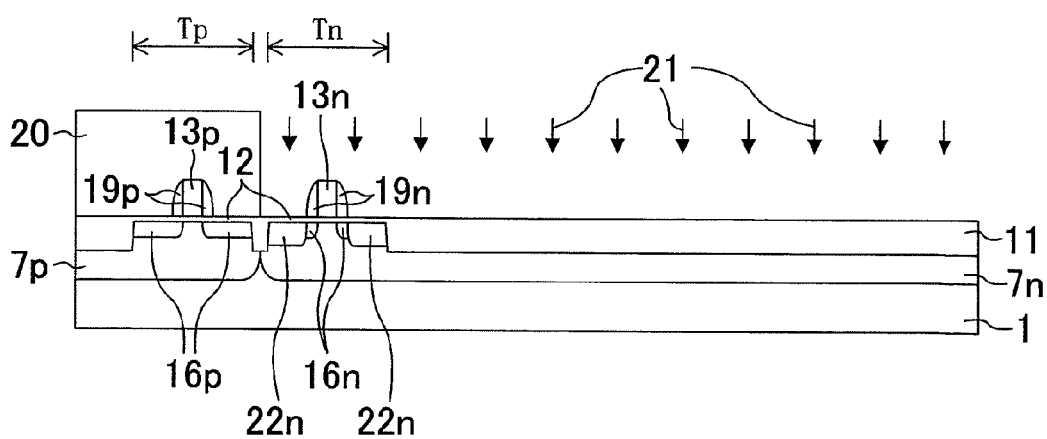
FIG. 16 is a cross-sectional view illustrating the step of forming heavily doped impurity regions in the N-well region.

Then, as shown in FIG. 16, a resist layer 20 is formed so as to expose the NMOS region Tn, whereby the PMOS region Tp is covered by the resist layer 20. Then, an N-type impurity element, such as phosphorus or arsenic, is ion implanted into the N-well region 7n by using the resist layer 20, the gate electrode 13n, and the sidewalls 19n as a mask. Arrows 21 in FIG. 16 indicate the implantation direction of the N-type impurity element. Thus, N-type heavily doped impurity regions 22n are formed on both outer sides of the N-type lightly doped impurity regions 16n. In the case of using arsenic as the N-type impurity element, the ion implantation is performed at, e.g., an implantation energy of about 20 KeV to about 60 KeV, and a dose of about $1 \times 10^{15}$ cm$^{-2}$ to about $3 \times 10^{15}$ cm$^{-2}$. Then, the resist layer 20 is removed.

Figure 17:
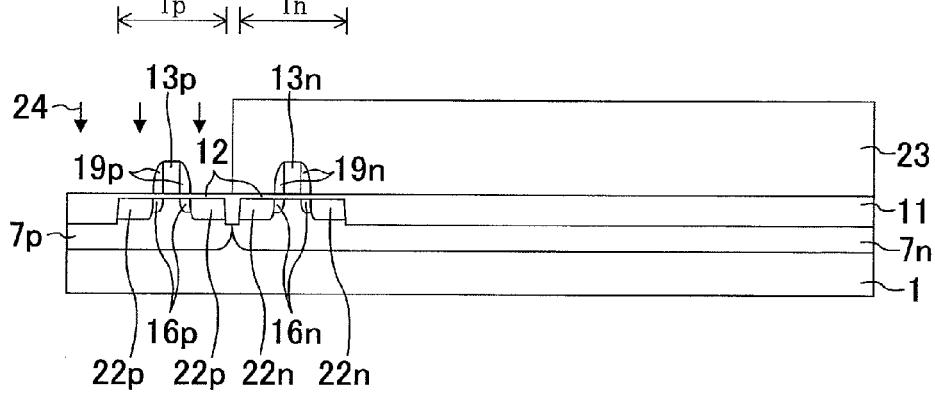
FIG. 17 is a cross-sectional view illustrating the step of forming heavily doped impurity regions in the P-well region.

Then, as shown in FIG. 17, a resist layer 23 is formed so as to expose the PMOS region Tp, whereby the NMOS region Tn is covered by the resist layer 23. Then, a P-type impurity element, such as boron, is ion implanted into the P-well region 7p by using the resist layer 23, the gate electrode 13p, and the sidewall 21p as a mask. Arrows 24 in FIG. 17 indicate the implanting direction of the P-type impurity element. Thus, P-type heavily doped impurity regions 22p are formed on both outer sides of the P-type lightly doped impurity regions 16p. In the case of using boron as the P-type impurity element, the ion implantation is performed at an implantation energy of about 20 KeV to about 60 KeV, and a dose of about $1 \times 10^{15}$ cm$^{-2}$ to about $3 \times 10^{15}$ cm$^{-2}$, when the ion species is, e.g., BF2. Then, the resist layer 23 is removed.

Figure 18:
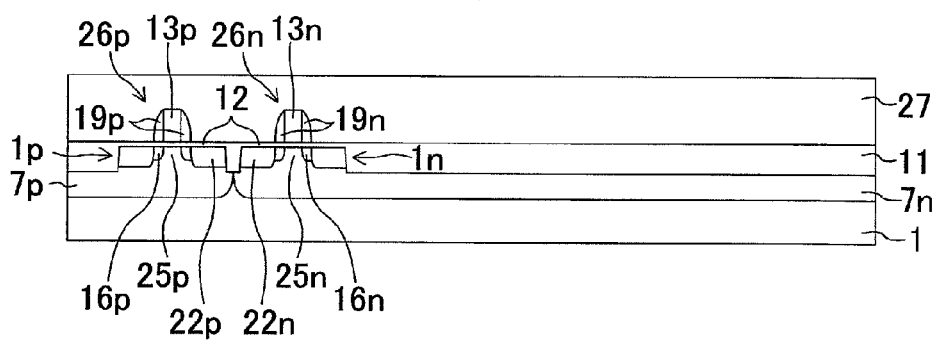
FIG. 18 is a cross-sectional view showing a state where a first planarizing layer is formed.

Then, an activation heat treatment is performed to activate the impurity elements implanted in the lightly doped impurity regions 16p, 16n and the heavily doped impurity regions 22p, 22n. In this activation heat treatment, a heat treatment is performed, for example, at a temperature of 900° C. for 10 minutes. Thus, as shown in FIG. 18, channel regions 25p, 25n are formed between the lightly doped impurity regions 16p, 16n so as to face the gate electrodes 13p, 13n with the gate oxide film 12 interposed therebetween, respectively, thereby forming a first active region 1p and a second active region 1n. The PMOS transistor 26p and the NMOS transistor 26n are formed in this manner.

Then, an insulating layer, such as SiO, is formed on the whole surface of the silicon substrate 1 so as to cover the PMOS transistor 26p and the NMOS transistor 26n. Then, the surface of the insulating layer is planarized by a CMP method or the like to form a first planarizing layer 27 having a thickness of about 600 nm.

Figure 19:
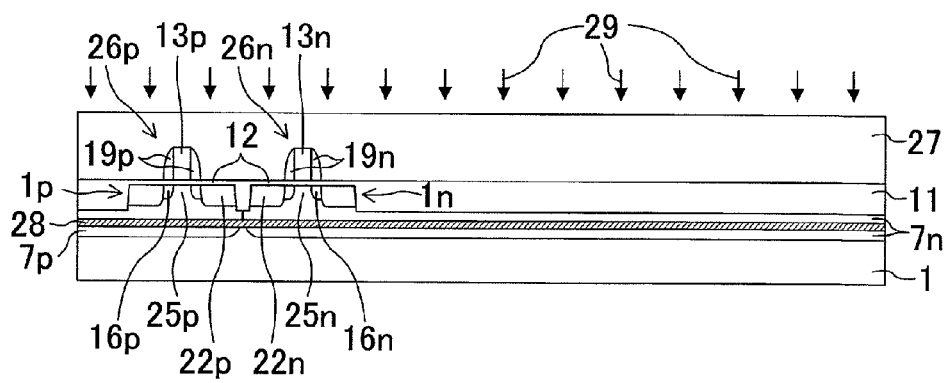
FIG. 19 is a cross-sectional view illustrating the step of forming a peel-off layer in the silicon substrate.

Then, the peel-off layer forming step is performed. In the peel-off layer forming step, as shown in FIG. 19, a peel-off material is ion implanted into the silicon substrate 1 through the first planarizing film 27 to form a peel-off layer 28. Arrows 29 in FIG. 19 indicate the implanting direction of the peel-off material. The peel-off material contains, for example, at least one of hydrogen and an inert gas element such as He and Ne.

The peel-off layer 28 is formed in a region that is located deeper in the silicon substrate 1 than the element isolation layer 11 and the channel regions 25p, 25n. The depth of the peel-off layer 28 can be controlled by ion implantation conditions of the peel-off material. For example, in the case where the peel-off material is hydrogen, the ion implantation is performed at an implantation energy of about 50 KeV to about 200 KeV, and a dose of about $2 \times 10^{16}$ cm$^{-2}$ to about $1 \times 10^{17}$ cm$^{-2}$. Moreover, the thickness of the peel-off layer 28 is about substantially one to several times the implantation projected standard deviation when implanting the peel-off material. For example, in the case where hydrogen ions are implanted into the silicon substrate 1 at an implantation energy of 150 KeV, the peel-off layer 28 has a thickness of about 100 nm to about 200 nm.

Figure 20:
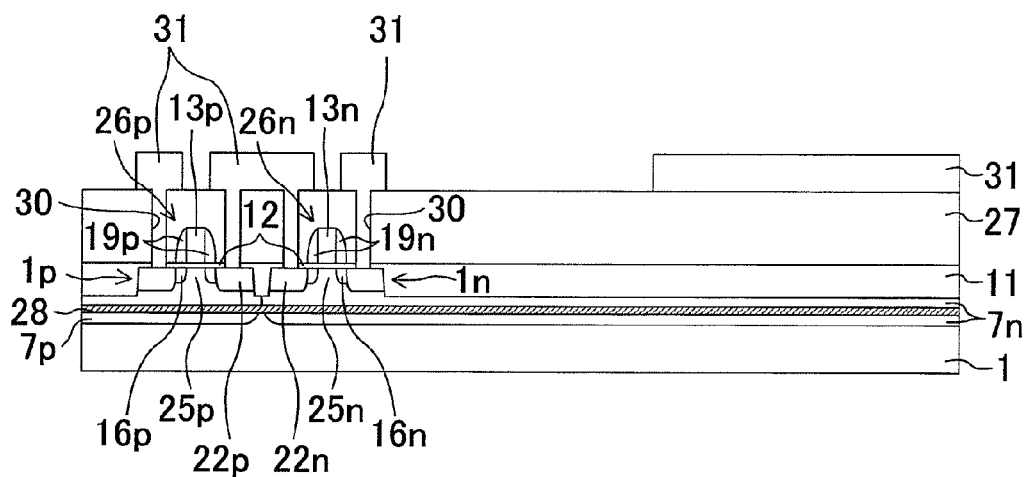
FIG. 20 is a cross-sectional view showing a state where a plurality of conductive films are formed.

Then, as shown in FIG. 20, contact holes 30 are formed in the first planarizing layer 27 and the gate oxide film 12 so as to expose the heavily doped impurity regions 22p, 22n at the bottoms of the contact holes 30. Then, the contact holes 30 are filled with a metal material, and the metal material is deposited with a thickness of about 300 nm on the whole surface of the first planarizing layer 27, thereby forming a metal layer. Then, the metal layer is patterned to form a plurality of conductive films 31, including source electrodes and drain electrodes which are respectively electrically connected to the heavily doped impurity regions 22p, 22n.

A material that is resistant to a heat treatment to be performed in a later step, more specifically, at least one metal material of refractory metal materials, such as TiN, TaN, HfN, ZrN, NbN, W, and Mo, and transition metal materials having a melting point of about 1,000° C. or higher, such as Ti, Ta, Co, Ni, Pt, Cu, Ag, and Au, are used as the metal material.

Note that, before forming the plurality of conductive films 31, an insulating film, such as an oxide film or a silicon nitride film, may be formed on the surface of the first planarizing layer 27 by a CVD method or the like. Moreover, in order to obtain low contact resistance, it is preferable to deposit a metal layer, such as Ti, Mo, W, Ta, Co, and Ni, with a thickness of about 10 nm to about 20 nm before depositing the metal material. Thus, the metal layer reacts with silicon by a heat treatment in a later step to form silicide such as $TiSi_2$, whereby desirable low resistance contacts can be implemented.

Then, a second planarizing layer 35, which covers the plurality of conductive films 31, is formed to form a flat bonding surface of the device portion D. That is, after forming an insulating layer, such as $SiO_2$, which covers the plurality of conductive films 31, the surface of the insulating layer is planarized by a CMP method or the like to form the second planarizing layer 35. It is preferable that this bonding surface of the device portion D have relatively high flatness with no difference in height.

In this regard, the inventors found the following fact after intensive studies of the semiconductor device S that is manufactured by bonding the device portion D with the substrate 36. That is, convex portions, which reflect the difference in level between the surface of the first planarizing layer 27 and the surfaces of the conductive films 31, are formed in the insulating layer, which is a base layer of the second planarizing layer 35. Moreover, even if the surface of the insulating layer is planarized by a CMP method or the like, the convex portions may not be completely planarized, and may remain in the second planarizing layer 35, whereby the difference in height may remain in the bonding surface of the device portion D. As a result, it becomes difficult to reduce the thickness of the device portion D having the plurality of conductive films 31, and to reliably bonding the device portion D with the substrate 36.

Thus, in the first embodiment, the assisting layer forming step of forming a planarization assisting layer 33, which covers the plurality of conductive films 31, over the first planarizing layer 27 is performed before forming the second planarizing layer 35. In the assisting layer forming step, the planarization assisting layer 33 is formed so that the height of the planarization assisting layer 33 from the surface of the first planarizing layer 27 located on the side opposite to the silicon substrate 1 becomes equal between the entire region where the conductive films 31 are formed, and a part of a region where no conductive film 31 is formed. In this assisting layer forming step, a base layer 32, which covers the plurality of conductive films 31, is first formed over the first planarizing layer 27, and then, convex portions 40 formed in the base layer 32, which reflect the difference in level between the surface of the first planarizing layer 27 and the surfaces of the conductive films 31, are entirely etched to form the planarization assisting layer 33.

Figure 21:
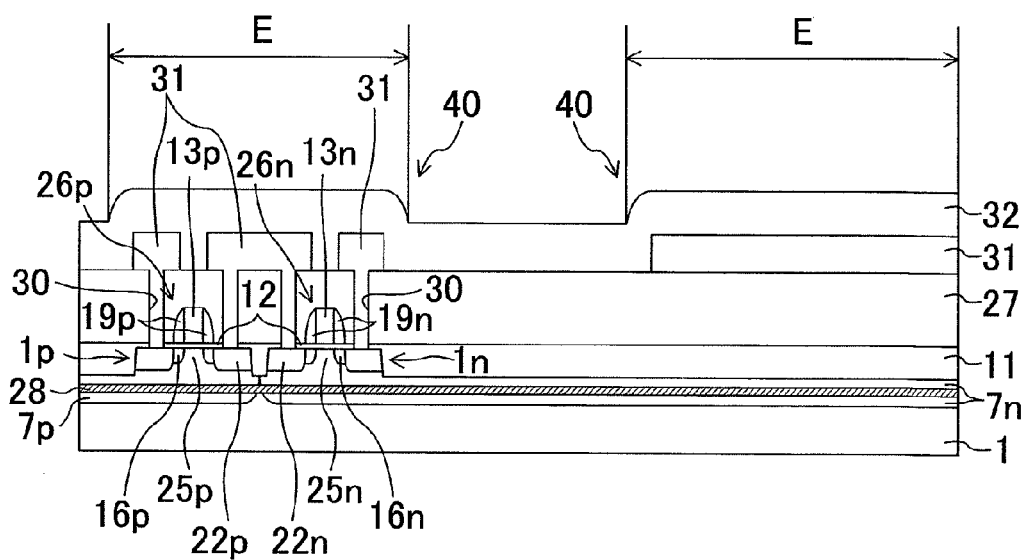
FIG. 21 is a cross-sectional view showing a state where a base layer, which covers the plurality of conductive films, is formed over the first planarizing layer.

That is, first, as shown in FIG. 21, an insulating base layer 32, such as, e.g., a $SiO_2$ layer, which covers the plurality of conductive films 31, is formed on the surface of the first planarizing layer 27. At this time, convex portions 40, which reflect the difference in level between the surface of the first planarizing layer 27 and the surfaces of the conductive films 31, are formed in the base layer 32. The thickness of the base layer 32 is set so as to be equal to the sum of the thickness of the conductive films 31 and the thickness of the base layer 32 that is to be left on the conductive films 31 by an etching method to be performed in a later step. For example, in the case where the thickness of the conductive films 31 is 300 nm, and the thickness of the base layer 32 to be left on the conductive films 31 is 50 nm, the thickness of the base layer 32 is set to 350 nm.

Then, a resist layer is formed so as to expose a region where the convex portions 40 in the base layer 32 are formed, whereby a region where no convex portion 40 is formed is covered by the resist layer. Then, the base layer 32 is subject to a wet etching method, a dry etching method, or the like by using the resist layer as a mask, whereby the convex portions 40 are etched to pattern the base layer 32. In the etching process of the base layer 32, each convex portion 40 is entirely etched with, for example, a width of 3.0 μm or less from the outer edge of a corresponding one of the conductive films 31 when viewed from the direction normal to the surface of the silicon substrate 1. Regions E in FIG. 21 herein indicate etching regions of the base layer 32.

Figure 22:
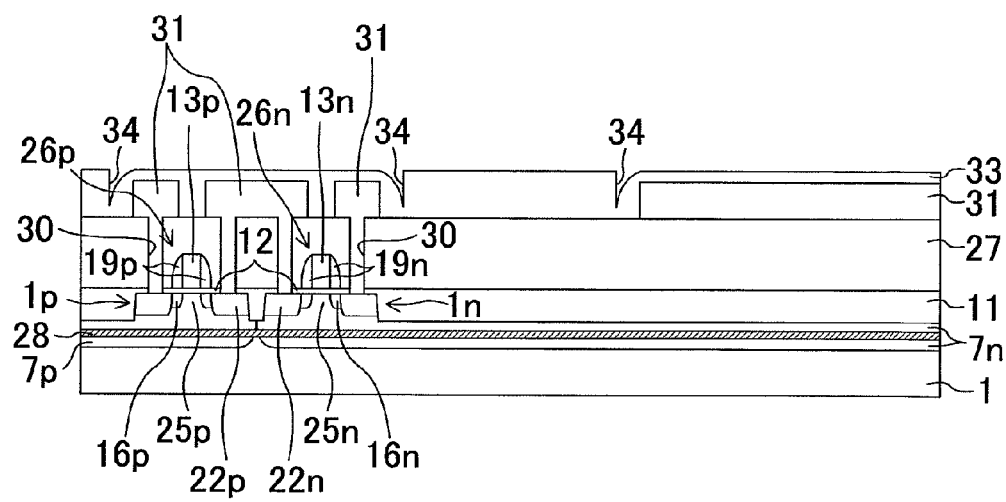
FIG. 22 is a cross-sectional view showing a state where a planarization assisting layer is formed.

At this time, for example, in the case where the thickness of the conducive films 31 is 300 nm, and the thickness of the base layer 32 is 350 nm, as described above, the etching time for the base layer 32 is set so that the base layer 32 is left with a thickness of 50 nm on the conductive films 31. Thus, since the etching process is performed so as not to expose the plurality of conductive films 31, contact portions between each conductive film 31 and the first planarizing layer 27, and the plurality of conductive films 31 do not contact a chemical in a cleaning step, in the case of performing the cleaning step when removing the resist layer in a later step, before forming the insulating layer or the like, and the like. Thus, disadvantages, such as penetration of the chemical into the contact interface between each conductive film 31 and the first planarizing layer 27, and corrosion of the conductive films 31, can be avoided. Thus, the planarization assisting layer 33 is formed as shown in FIG. 22. In the planarization assisting layer 33, grooves 34, each extending along the outer edge of a corresponding one of the conductive films 31 in at least a part of the outer periphery of the conductive film 31, are formed by etching the base layer 32.

Figure 23:
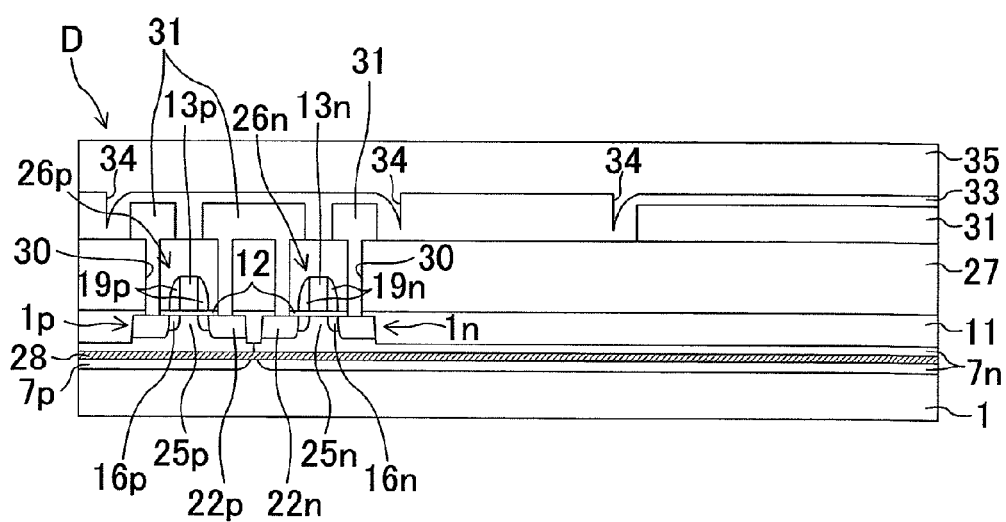
FIG. 23 is a cross-sectional view showing a state where a second planarizing layer is formed.

Then, a base layer of a second planarization layer 35 is formed with a thickness of about 1 μm to about 3 μm on the planarization assisting layer 33, and the base layer is planarized to a thickness of about 0.5 μm to about 1.5 μm by a CMP method or the like. Thus, the second planarizing layer 35 is formed as shown in FIG. 23, with the surface roughness (microroughness) of the base layer of 0.5 nm or less, preferably 0.3 nm or less. Thus, the device portion D is formed on the silicon substrate 1.

Figure 24:
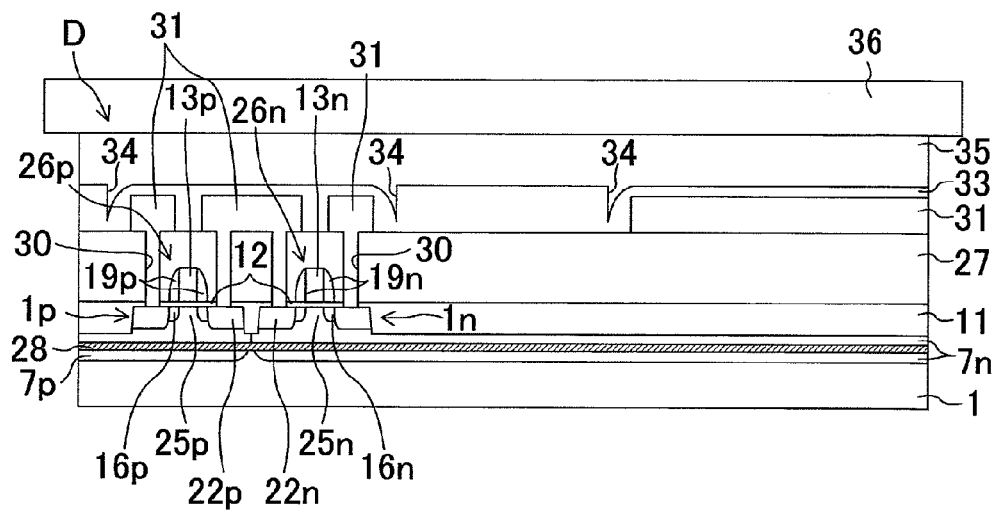
FIG. 24 is a cross-sectional view showing a device portion bonded with a glass substrate.

Then, the bonding step is performed. In the bonding step, as shown in FIG. 24, the device portion D formed on the silicon substrate 1 is bonded with a substrate 36. That is, the silicon substrate 1 is bonded with the substrate 36 with the device portion D interposed therebetween. For example, a glass substrate is used as the substrate 36. Note that other substrates, such as a semiconductor substrate, may be used as the substrate 36.

That is, first, the surface of the second planarizing layer 35 and the surface of the glass substrate 36 are cleaned with a SC1 solution for about 5 minutes at a temperature of about 20° C. to about 80° C. The SC1 solution is a solution prepared by, for example, mixing aqueous ammonia ($NH_4OH$), a hydrogen peroxide solution ($H_2O_2$), and pure water ($H_2O$) at a ratio of 0.2 to 1:1:5, or the like. Then, the device portion D is aligned with the glass substrate 36, and the surface of the second planarizing layer 35 is brought into contact with the glass substrate 36 to bond the device portion D and the glass substrate 36 together. Thus, by self bonding due to van der Waals force and hydrogen bonds, the device portion D and the glass substrate 36 are bonded together on the surface of the second planarizing layer 35.

Figure 25:
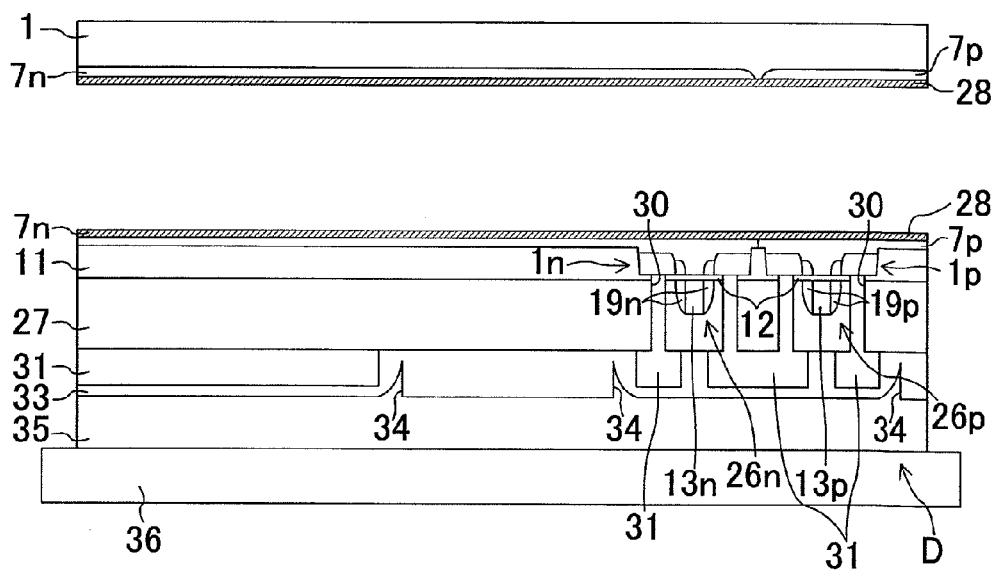
FIG. 25 is a cross-sectional view showing a state where a part of the silicon substrate is separated.

Then, the separating step is performed. In the separating step, a heat treatment is performed at a temperature of about 400° C. to about 600°, whereby, as shown in FIG. 25, a part of the silicon substrate (the substrate layer) 1 bonded with the glass substrate 36 with the device portion D interposed therebetween (that is, a part located on the side opposite to the gate electrodes 13p, 13n with the peel-off layer 28 interposed therebetween) is separated and removed along the peel-off layer 28. As a result, the device portion D (the PMOS transistor 26p and the NMOS transistor 26n) is transferred onto the glass substrate 36.

Thereafter, the peel-off layer 28 of the silicon substrate 1 is removed by an etching method or the like. Then, by using the element isolation layer 11 as an etch stopper, the substrate layer (the P-well region 7p and the N-well region 7n) 1 is etched until the element isolation layer 11 is exposed. The thickness of the substrate layer 1 is reduced in this manner for element isolation. Note that this reduction in thickness of the substrate layer 1 may be performed by other methods such as a CMP method.

Then, a protective film 37, which covers the device portion D, is formed in order to protect the surface of the substrate layer 1, and to ensure an electrical insulating property of the transistors 26p, 26n. At this time, a heat treatment or a hydrogenation process is performed, as necessary, at a temperature of about 400° C. to about 600° C. in order to adjust the threshold voltage of the PMOS transistor 26p and the NMOS transistor 26n. Note that the step of etching the substrate layer 1 until the element isolation layer 11 is exposed need not necessarily be performed. The semiconductor device S, having the device portion (the PMOS transistor 26p and the NMOS transistor 26n) provided on the surface of the glass substrate 36, is formed in this manner.

Effects of the First Embodiment

Thus, according to the first embodiment, after bonding the device portion D with the glass substrate 36 by using the surface of the second planarizing layer 35 as a bonding surface, a part of the substrate layer (the silicon substrate) 1 is separated and removed along the peel-off layer 28 formed by hydrogen implantation. Moreover, before forming the second planarizing layer 35, the planarization assisting layer 33 is formed so that the height of the planarization assisting layer 33 from the surface of the first planarizing layer 27 becomes equal between the entire region where the conductive films 31 are formed, and a part of the region where no conductive film 31 is formed. Thus, the operating speed of the PMOS transistor 26p and the NMOS transistor 26n, which are formed in the substrate layer 1, can be increased, and the parasitic capacitance thereof can be reduced. Moreover, the device portion D can be reliably bonded with the glass substrate 36.

That is, first, by separating and removing a part of the substrate layer 1 along the peel-off layer 28, the channel regions 25p, 25n of the PMOS transistor 26p and the NMOS transistor 26n can be formed with a reduced thickness on the glass substrate 36. Thus, the operating speed of the transistors can be increased, and the parasitic capacitance thereof can be reduced.

Incidentally, in common manufacturing methods that do not include the assisting layer forming step, convex portions, which reflect the difference in level between the surface of the first planarizing layer 27 and the surfaces of the conductive films 31, are formed in the insulating layer, which is a base layer of the second planarizing layer 35. Even if the surface of the base layer is planarized by a CMP method or the like, the convex portions may not be completely planarized, whereby the difference in height can remain in the bonding surface of the device portion D. As a result, it becomes difficult to reliably bond the device portion D having the plurality of conductive films 31, with the substrate 36.

In this regard, in the first embodiment, the assisting layer forming step is performed in the device portion forming step, in which the planarization assisting layer 33 is formed so that the height of the planarization assisting layer 33 becomes equal between the entire region where the conductive films 31 are formed, and a part of the region where no conductive film 31 is formed. Thus, the difference in level between the surface of the first planarizing layer 27 and the surfaces of the conductive films 31 can be prevented from being reflected on the insulating layer 34. Thus, the height of the second planarizing layer 35 from the surface of the first planarizing layer 27 located on the side opposite to the silicon substrate 1 can be made equal between the region where the conductive films 31 are formed, and the region where no conductive film 31 is formed. Thus, the difference in height can be prevented from remaining in the bonding surface of the device portion D, whereby the flatness of the bonding surface of the device portion D can be improved. As a result, the device portion D having the plurality of conductive films 31 can be reliably bonded with the glass substrate 36.

Moreover, in the assisting layer forming step, each convex portion 40 is entirely etched with a width of 3.0 µm or less from the outer edge of a corresponding one of the conductive films 31 when viewed from the direction normal to the surface of the silicon substrate 1. Thus, even if the grooves 34 are formed in at least a part of the outer periphery of the respective conductive films 31 in the planarization assisting layer 33, the groove width can be made sufficiently small. Thus, the grooves 34 can be reliably embedded by the second planarizing layer 35, and the flatness of the bonding surface of the device portion D (the surface of the second planarizing layer 35) can be sufficiently improved.

Second Embodiment

FIGS. 26 through 29 show a second embodiment of the present invention. Note that, in the following embodiments, the same parts as those shown in FIGS. 1 through 25 are denoted by the same reference characters, and detailed description thereof will be omitted. FIGS. 26 through 29 are diagrams illustrating a device portion forming step in a manufacturing method of a semiconductor device S of the second embodiment.

In the first embodiment, the planarization assisting layer 33 is formed by entirely etching the convex portions 40 in the assisting layer forming step. However, in an assisting layer forming step of the second embodiment, the planarization assisting layer 33 is formed by partially etching the convex portions 40.

That is, in the assisting layer forming step of the second embodiment, the planarization assisting layer 33 is formed so that the height of the planarization assisting layer 33 from the surface of a first planarizing layer 27 located on the side opposite to a silicon substrate 1 becomes equal between a part of a region where conductive films 31 are formed, and a part of a region where no conductive film 31 is formed.

Figure 26:
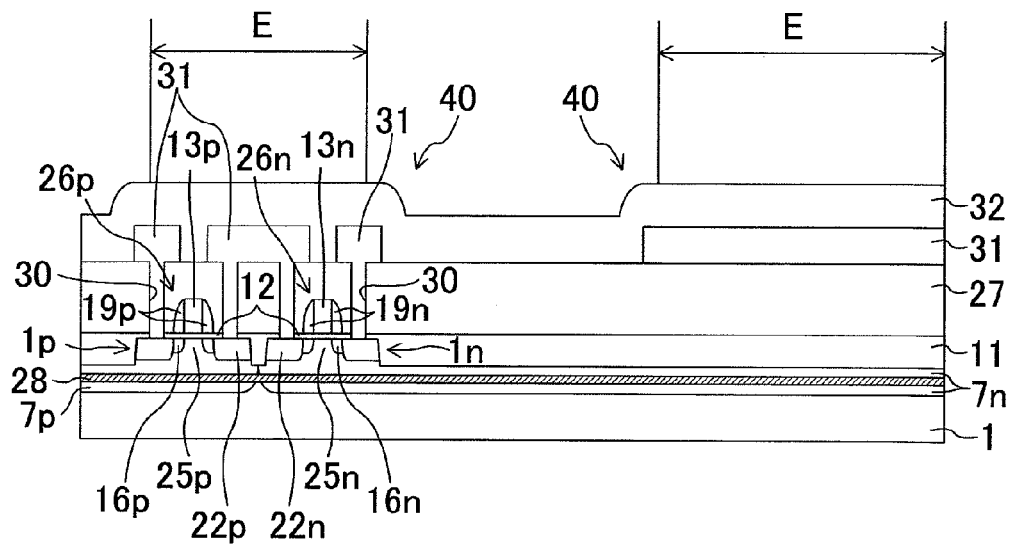
FIG. 26 is a cross-sectional view showing regions to be etched in a base layer in a second embodiment.
Figure 27:
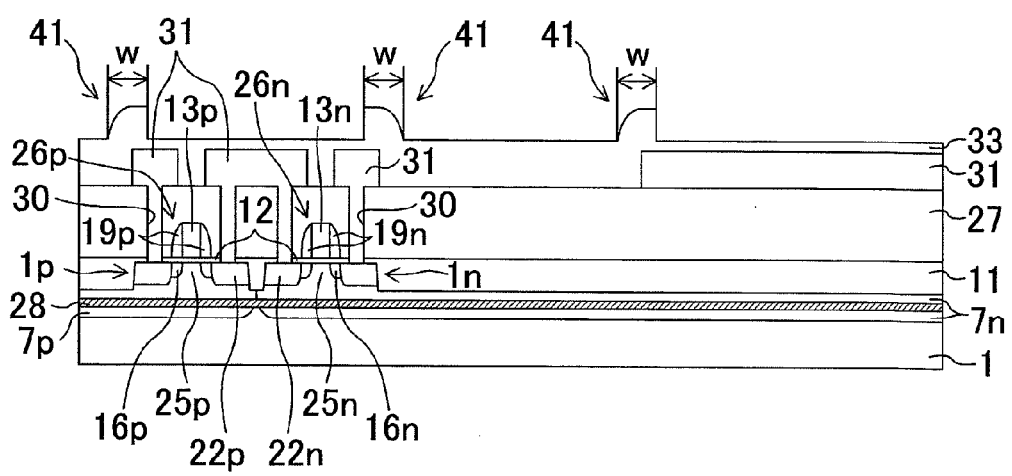
FIG. 27 is a cross-sectional view showing a state where a planarization assisting layer is formed in the second embodiment.

First, as shown in FIG. 26, a base layer 32, which covers the plurality of conductive films 31, is formed over the first planarizing layer 27. Then, a resist layer is formed, which exposes the remaining part of each convex portion 40 so that a part 41 of each convex portion 40 is left over the outer edge of a corresponding conductive film 31. The remaining part of each convex portion 40 is etched by using the resist layer as a mask. Regions E of FIG. 26 indicate etching regions of the base layer 32 in the second embodiment. In this etching process of the base layer 32, as shown in FIG. 27, the convex portions 40 are etched so that the parts 41 of the convex portions 40 are left with a width w of 3.0 μm or less in the direction perpendicular to the outer edge of the respective conductive films 31 when viewed from the direction normal to the surface of the silicon substrate 1.

That is, the parts 41 of the convex portions 40, which reflect the difference in level between the surface of the first planarizing layer 27 and the surfaces of the conductive films 31, are left in the planarization assisting layer 33. The parts 41 of the convex portions 40 have a width w of 3.0 μm in the direction perpendicular to the outer edge of the respective conductive films 31 when viewed from the direction normal to the surface of the silicon substrate 1. The planarization assisting layer 33, having the parts 41 of the convex portion 40 being left therein, is formed in this manner.

Figure 28:
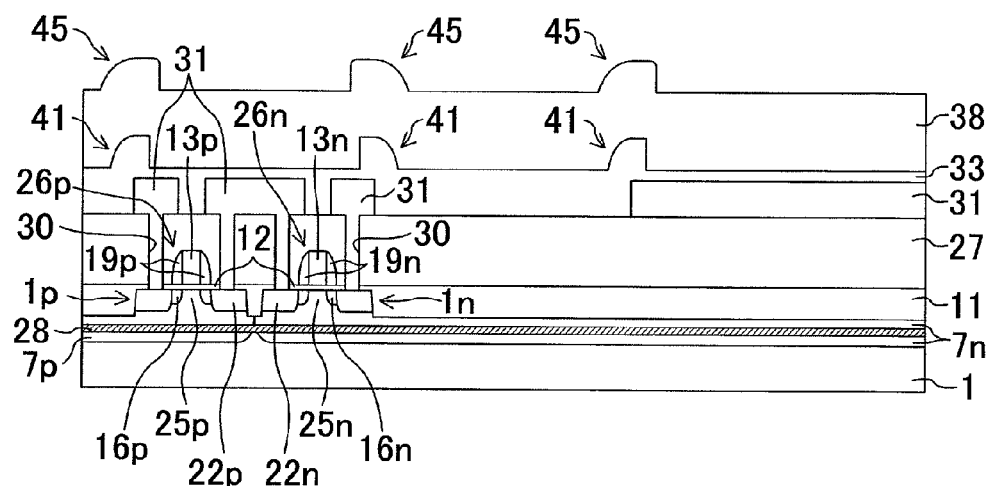
FIG. 28 is a cross-sectional view showing a state where an insulating layer, which covers the planarization assisting layer, is formed in the second embodiment.

Then, an insulating layer 38, which covers the planarization assisting layer 33, is formed as shown in FIG. 28. At this time, convex portions 45, which reflect the parts 41 of the convex portions 40 formed in the planarization assisting layer 33, are formed in the insulating layer 38. This insulating layer 38 is formed with a thickness of e.g., about 1.0 μm to about 3.0 μm.

Figure 29:
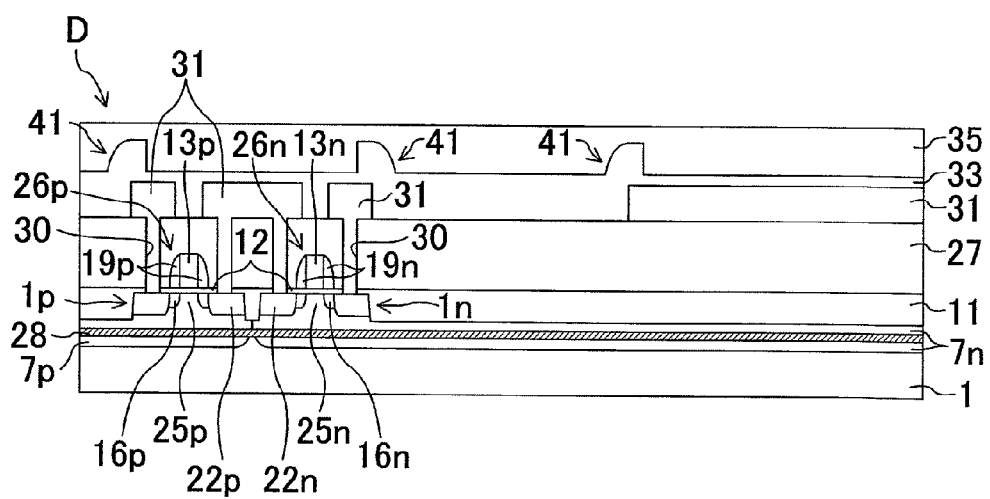
FIG. 29 is a cross-sectional view showing a state where a second planarizing layer is formed in the second embodiment.

Then, as shown in FIG. 29, the surface of the insulating layer 38 is subject to a CMP method or the like to remove the convex portions 45 formed in the insulating layer 38, and to planarize the surface of the insulating layer 38, thereby forming a second planarizing layer 35. Then, a bonding step is performed to bond a device portion D with a glass substrate 36, whereby the semiconductor device S is manufactured.

Effects of the Second Embodiment

Thus, in the second embodiment as well, the planarization assisting layer 33 is formed before forming the second planarizing layer 35, so that the height of the planarization assisting layer 33 from the surface of the first planarizing layer 27 becomes partially equal between the region where the conductive films 31 are formed, and the region where no conductive film 31 is formed. Thus, the difference in level between the surface of the first planarizing layer 27 and the surfaces of the conductive films 31 can be prevented from being reflected on the second planarizing layer 35. That is, since the width of the convex portions 45 formed in the insulating layer 38 can be reduced, the convex portions 45 can be reliably removed by the planarization process such as a CMP method, whereby the flatness of the surface of the second planarizing layer 35 (the bonding surface of the device portion D) can be improved. As a result, effects similar to those of the first embodiment can be obtained.

Moreover, in the assisting layer forming step, the convex portions 40 are etched so that the parts 41 of the convex portions 40 are left with a width of 3.0 μm or less in the direction perpendicular to the outer edge of the respective conductive films 31 when viewed from the direction normal to the surface of the silicon substrate 1. Thus, the width w of the convex portions 45, which are formed in the insulating layer 38 so as to reflect the parts 41 of the convex portions 40, can be sufficiently reduced. As a result, the convex portions 45 formed in the insulating layer 38 can be more reliably removed.

Third Embodiment

Figure 30:
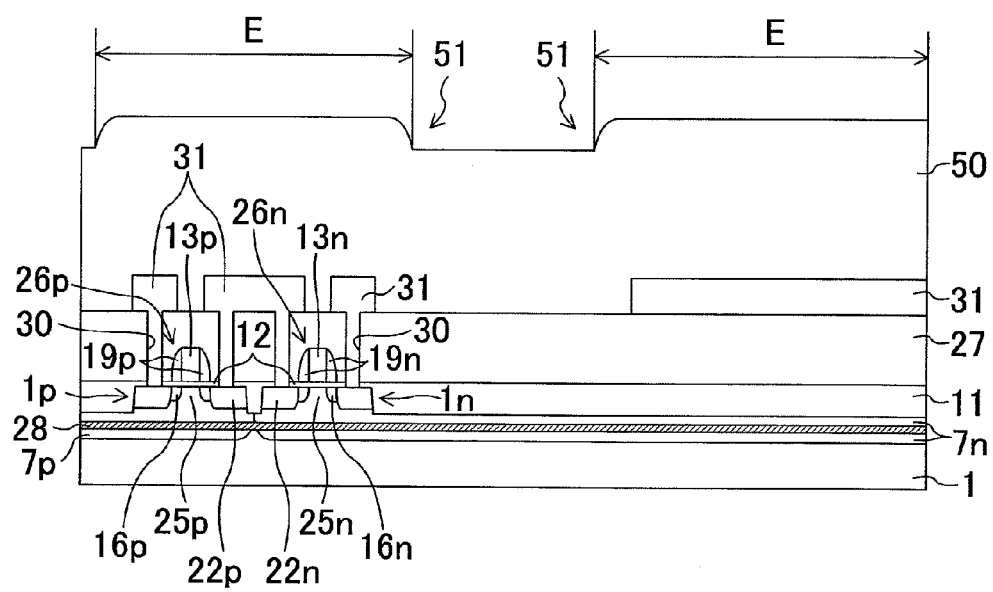
FIG. 30 is a cross-sectional view showing a state where a base layer of a planarizing insulating layer is formed in a third embodiment.
Figure 31:
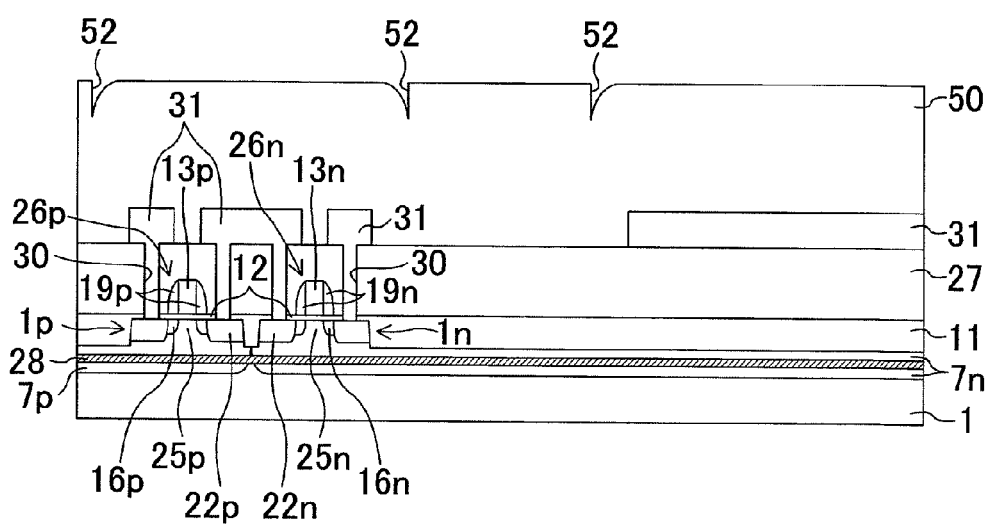
FIG. 31 is a cross-sectional view showing a state where convex portions of the base layer are etched in the third embodiment.
Figure 32:
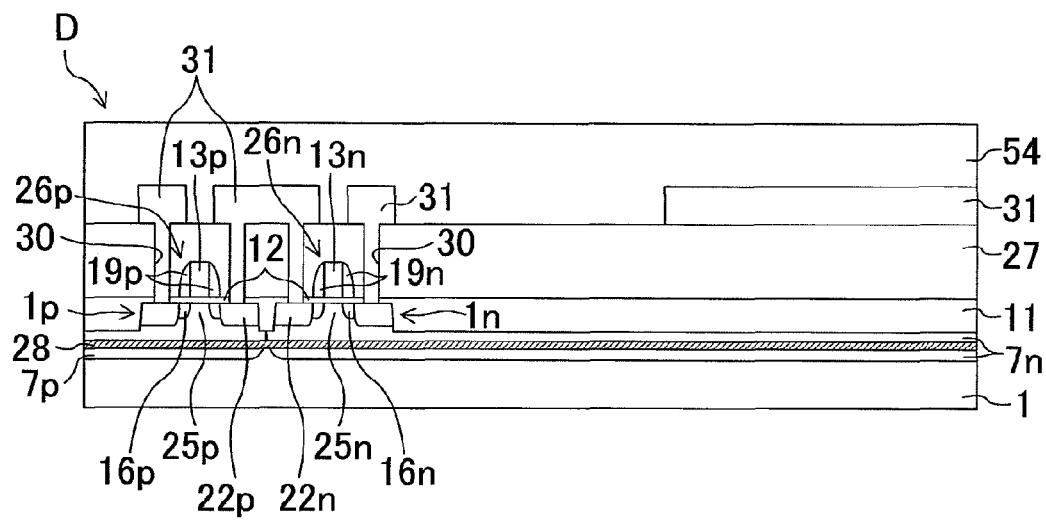
FIG. 32 is a cross-sectional view showing a state where the planarizing insulating layer is formed in the third embodiment.

FIGS. 30 through 32 show a third embodiment of the present invention. FIGS. 30 through 32 are diagrams illustrating a device portion forming step in a manufacturing method of a semiconductor device S of the third embodiment.

In the first embodiment and the second embodiment, the device portion D, which has the surface of the second planarizing layer 35 as a bonding surface, is formed by forming the second planarizing layer 35 after the planarization assisting layer 33 is formed. However, in the third embodiment, a device portion D, which has the surface of a planarizing insulating layer 54 as a bonding surface, is formed by forming the planarizing insulating layer 54, which is an insulating layer that covers a plurality of conductive films 31.

The semiconductor device S of the present embodiment is formed by bonding the device portion D with a glass substrate 36, where the device portion D has transistors 26p, 26n formed in a substrate layer 1, a planarizing layer (corresponding to the first planarizing layer in the first embodiment) 27 that at least partially covers the transistors 26p, 26n, a plurality of conductive films 31 formed adjacent to each other on the surface of the planarizing layer 27, and a planarizing insulating layer 54 that covers the plurality of conductive films 31.

Moreover, the height of the planarizing insulating layer 54 from the surface of the planarizing layer 27 located on the side opposite to the substrate layer 1 is equal between the entire region where the conductive films 31 are formed, and the entire region where no conductive film 31 is formed, and is the highest in the region where the conductive films 31 are formed. That is, the planarizing insulating layer 54 is formed so as to have a flat surface on the side opposite to the silicon substrate 1.

A method for manufacturing the semiconductor substrate S includes a device portion forming step, a peel-off layer forming step, a bonding step, and a separating step. Note that the peel-off layer forming step, the bonding step, and the separating step are similar to those of the first embodiment.

In the device portion forming step, as shown in FIG. 30, after a plurality of conductive films 31 are formed on the surface of the planarizing layer 27, a base layer 50, which covers the plurality of conductive films 31, is formed over the planarizing layer 27. At this time, the base layer 50 is formed with a thickness of, e.g., about 1.0 μm to about 3.0 μm. Then, convex portions 51, which are formed in the base layer 50 so as to reflect the difference in level between the surface of the planarizing layer 27 and the surfaces of the conductive films 31, is at least partially etched to form a planarizing insulating layer 54.

In the third embodiment, the convex portions 51 are entirely etched with a width of 3.0 μm or less from the outer edge of the respective conductive films 31 when viewed from the direction normal to the surface of the silicon substrate 1. Regions E of FIG. 30 indicate etching regions of the base layer 50 in the third embodiment.

First, a resist layer is formed so as to expose the entire regions of the convex portions 51 with a width of 3.0 μm from the outer edge of the respective conductive films 31. Then, the convex portions 51 are entirely etched by using the resist film as a mask. At this time, as shown in FIG. 31, grooves 52, each extending along a corresponding one of the conductive films 31 in at least a part of the outer periphery of the conductive film 31, are formed in the base layer 50.

Then, as shown in FIG. 32, the surface of the base layer 50 is subject to a planarization process, such as a CMP method, to remove the grooves 52 and to planarize the surface of the base layer 50, thereby forming a planarizing insulating layer 54. Then, the bonding step is performed to bond the device portion D with a glass substrate 36 by using the surface of the planarizing insulating layer 54 as a bonding surface, whereby the semiconductor device S is manufactured.

Effects of the Third Embodiment

Thus, according to the third embodiment, the planarizing insulating film 54 is formed in the device portion forming step so that the height of the planarizing insulating layer 54 from the surface of the planarizing layer 27 located on the side opposite to the silicon substrate 1 becomes equal between the entire region where the conductive films 31 are formed, and the entire region where no conductive film 31 is formed, and becomes the highest in the region where the conductive films 31 are formed. That is, since the planarizing insulating layer 54 is formed so as to have a flat surface, the difference in height can be prevented from remaining in the bonding surface of the device portion D. As a result, as in the first embodiment, the device portion D having the plurality of conductive films 31 can be reduced in thickness, and can be reliably bonded with the glass substrate 36. In this case, since the surface of the planarizing insulating layer 54, which directly covers the plurality of conductive films 31, can be used as the bonding surface, it is not necessary to form a plurality of layers that covers the plurality of conductive films 31. That is, the step of further laminating a planarizing layer on an insulating layer that covers the plurality of conductive films 31 can be omitted, whereby an increase in the number of steps can be prevented.

Fourth Embodiment

Figure 33:
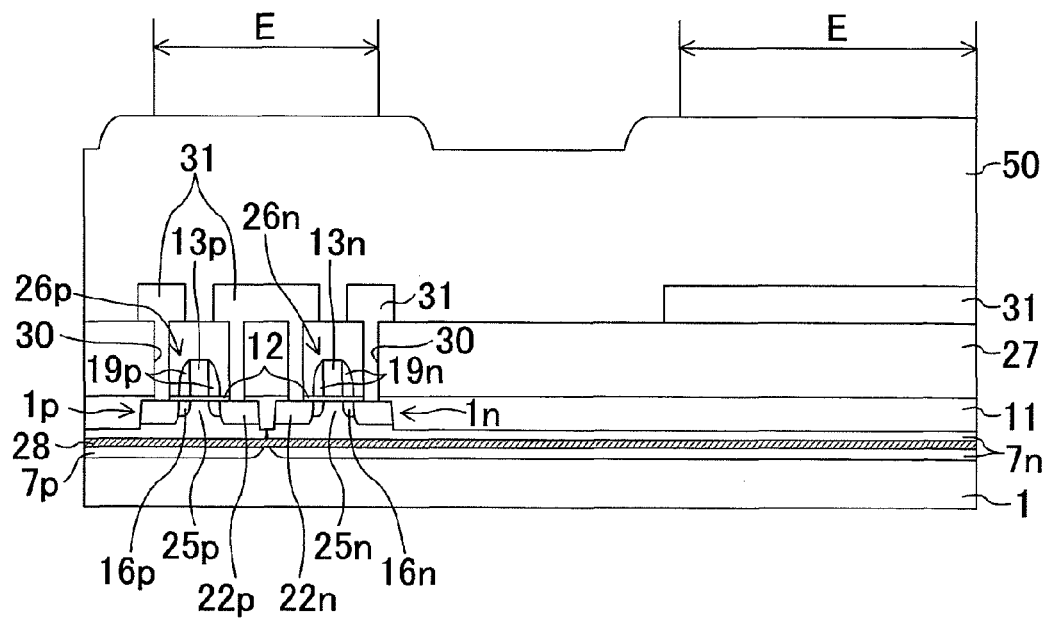
FIG. 33 is a cross-sectional view showing regions to be etched in a base layer in a fourth embodiment.
Figure 34:
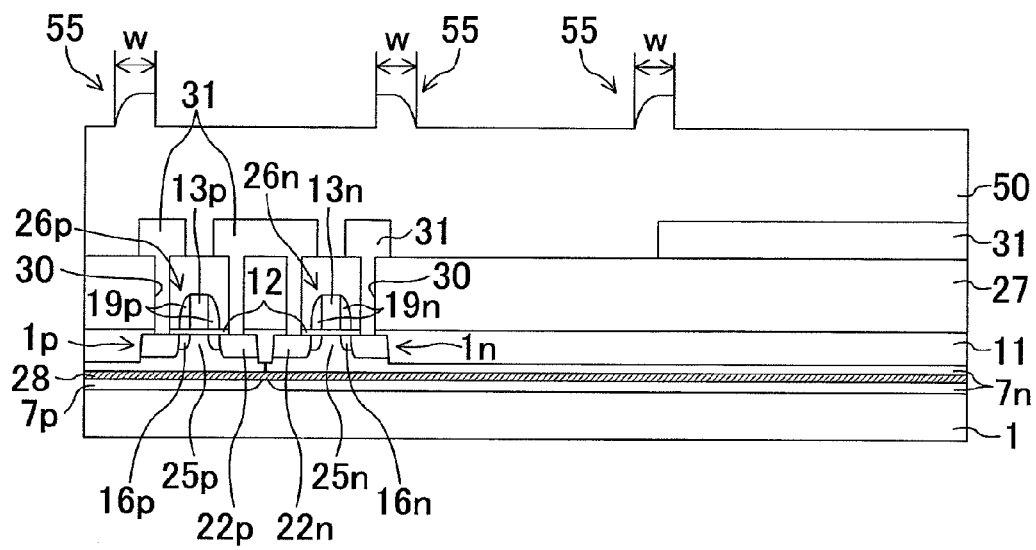
FIG. 34 is a cross-sectional view showing a state where convex portions of the base layer are etched in the fourth embodiment.

FIGS. 33 and 34 show a fourth embodiment of the present invention. FIGS. 33 and 34 are diagrams illustrating a device portion forming step in a manufacturing method of a semiconductor device S of the fourth embodiment.

In the third embodiment, the convex portions 51 formed in the base layer 50 are entirely etched to form the planarizing insulating layer 54. However, in the fourth embodiment, convex portions 51 are partially etched to form a planarizing insulating layer 54.

That is, in the device portion forming step of the fourth embodiment, first, as shown in FIG. 33, a plurality of conductive films 31 are formed on the surface of a planarizing layer 27, and then, a base layer 50, which covers the plurality of conductive films 31, is formed. At this time, the base layer 50 is formed with a thickness of, e.g., about 1.0 μm to about 3.0 μm.

Then, a resist layer is formed, which exposes the remaining part of each convex portion 51 so that a part 55 of each convex portion 51 is left over the outer edge of a corresponding conductive film 31. Thereafter, the remaining part of each convex portion 51 is etched by using the resist layer as a mask. Regions E of FIG. 33 indicate etching regions of the base layer 50 in the fourth embodiment. In this etching process of the base layer 50, as shown in FIG. 34, the convex portions 51 are etched so that the parts 55 of the convex portions 51 are left with a width w of 3.0 μm or less in the direction perpendicular to the outer edge of the respective conductive films 31 when viewed from the direction normal to the surface of the silicon substrate 1. The base layer 50, having the parts 55 of the convex portions 51 being left therein, is formed in this manner.

Then, the surface of the base layer 50 is subject to a planarization process, such as a CMP method, to remove the parts 55 of the convex portions 51 which are left in the base layer 50, and to planarize the surface of the base layer 50. Thus, a planarizing insulating layer 54 having a planarized surface is formed in a manner similar to that of FIG. 32 shown in the third embodiment. Then, as in the third embodiment, the bonding step is performed to bond the device portion D with the glass substrate 36 by using the surface of the planarizing insulating layer 54 as a bonding surface, whereby the semiconductor device S is manufactured.

Effects of the Fourth Embodiment

Thus, according to the fourth embodiment as well, since the planarizing insulating layer, which directly covers the plurality of conductive films, is formed so as to have a flat surface, the difference in height can be prevented from remaining in the bonding surface of the device portion D. As a result, effects similar to those of the third embodiment can be obtained.

Moreover, the surface of the base layer 50 is planarized after etching the base layer 50 so that the parts 55 of the convex portions 51 are left with a width of 3.0 μm or less in the direction perpendicular to the outer edge of the respective conductive films 31 when viewed from the direction normal to the surface of the silicon substrate 1. Thus, the parts 55 of the convex portions 51, which are left in the base layer 50 before the planarization process, have a sufficiently small width w. Thus, the parts 55 of the convex portions 51 can be reliably removed by the planarization process such as a CMP method.

Other Embodiments

Figure 35:
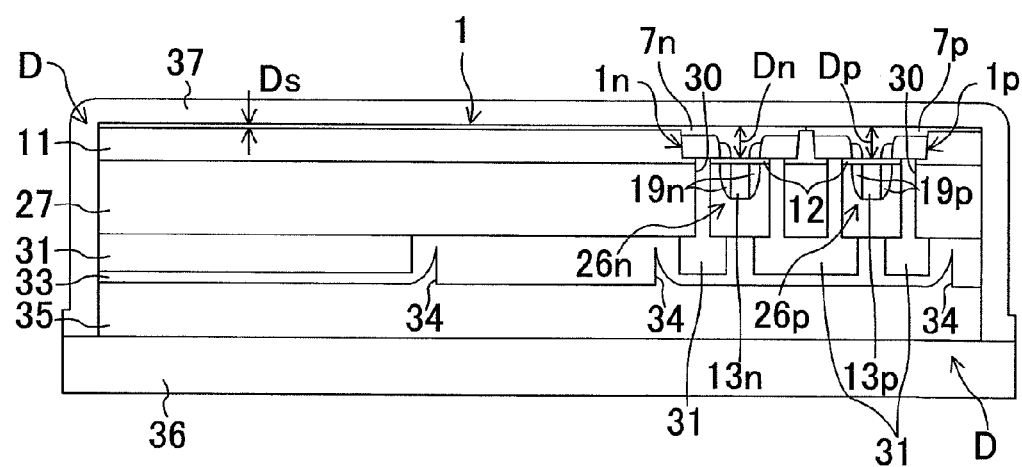
FIG. 35 is a cross-sectional view showing the thickness of channel regions in other embodiments.

In the first embodiment, after the device portion D is bonded with the glass substrate 36, the thickness of the substrate layer 1 is reduced until the element isolation layer 11 is exposed. However, the present invention is not limited to this, and as shown in FIG. 35, the thickness of the substrate layer 1 may be reduced until a thickness Ds of the substrate layer 1 on the element isolation layer 11 has a predetermined value (e.g., 50 nm to 200 nm).

Moreover, in the case of forming transistors in which a charge depletion layer is formed in the channel regions 25p, 25n entirely in the thickness direction of the substrate layer 1 when a voltage is applied to the gate electrodes 13p, 13n (hereinafter referred to as the "full depletion type transistors"), the thickness of the substrate layer 1 needs to be set as appropriate according to the impurity concentration of the channel regions 25p, 25n. For example, in the case where the impurity concentration of the channel regions 25p, 25n is about $1 \times 10^{17}$ cm$^{-3}$ to about $5 \times 10^{17}$ cm$^3$, the respective thicknesses Dp, Dn of the substrate layer 1 in the channel regions 25p, 25n are preferably about 30 nm to about 50 nm, and more preferably, about 30 nm to about 100 nm.

In the case of forming the full depletion type transistors, the thickness of the element isolation region 11, which is to be formed later, is controlled by setting the depth of the trench 9 as appropriate. The thicknesses Dp, Dn of the substrate layer 1 in the channel regions 25p, 25n of the transistors 26p, 26n can be controlled in this manner.

Figure 36:
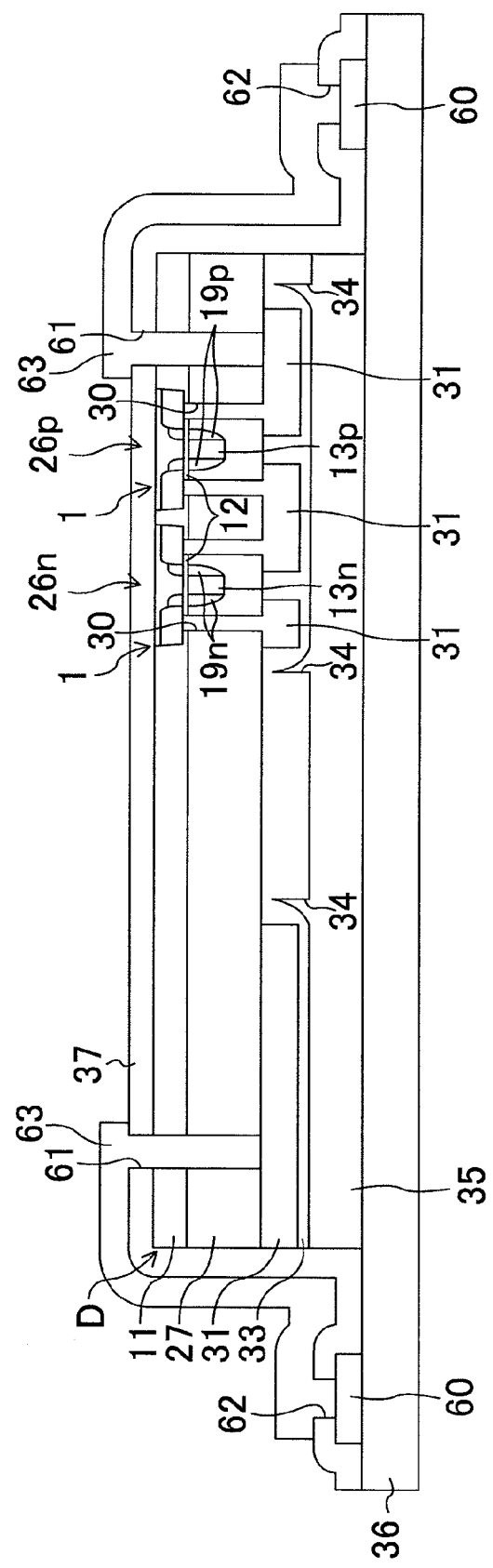
FIG. 36 is a cross-sectional view showing a device portion connected to electric devices on a glass substrate.
Figure 37:
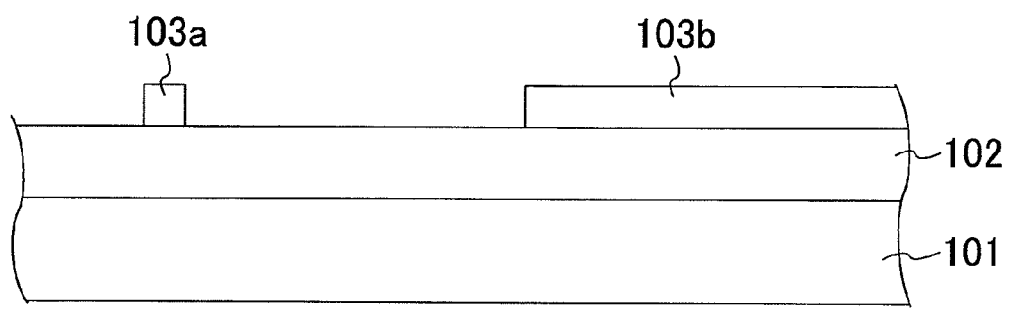
FIG. 37 is an enlarged cross-sectional view showing a state where a plurality of conductive films are formed in a conventional manufacturing process of a semiconductor device.
Figure 38:
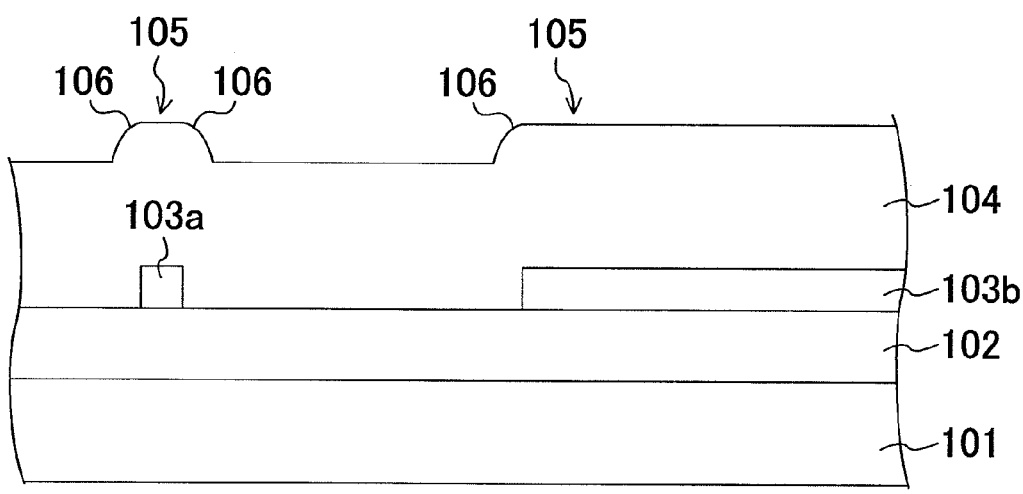
FIG. 38 is a cross-sectional view showing a state where a planarizing layer, which covers the plurality of conductive layers, is formed in the conventional manufacturing process of a semiconductor device.
Figure 39:
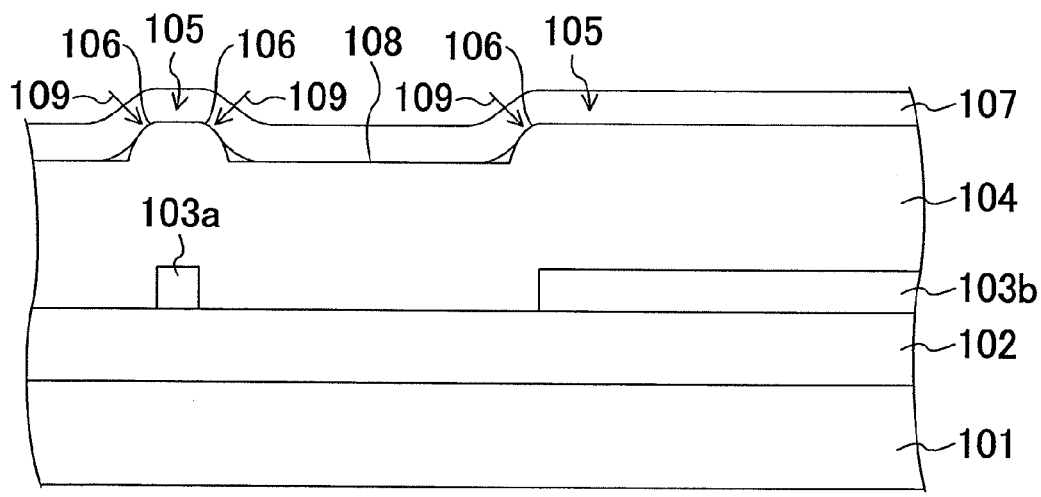
FIG. 39 is a cross-sectional view illustrating the step of planarizing an insulating layer in the conventional manufacturing process of a semiconductor device.
Figure 40:
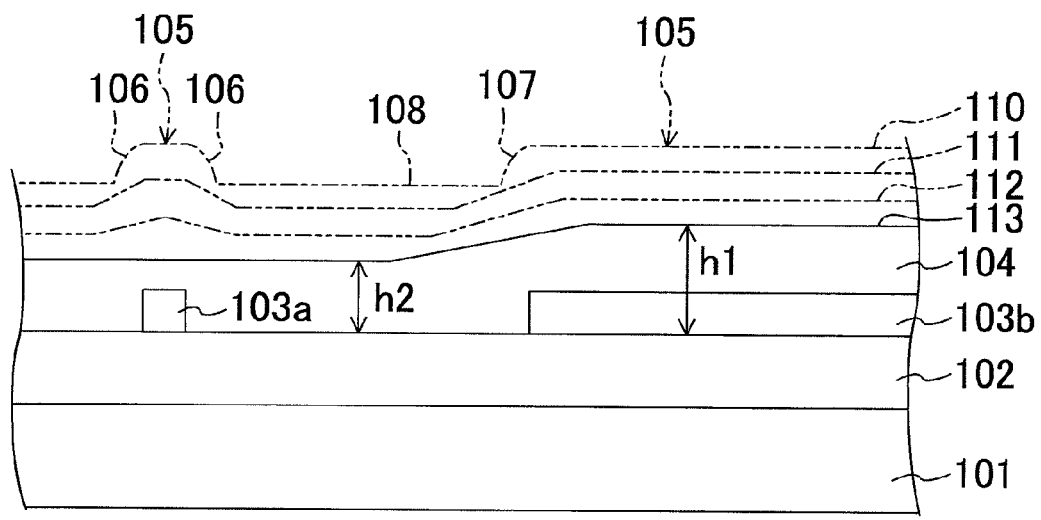
FIG. 40 is a cross-sectional view showing how the surface of the insulating layer changes by the planarization in the conventional manufacturing process of a semiconductor device.
Figure 41:
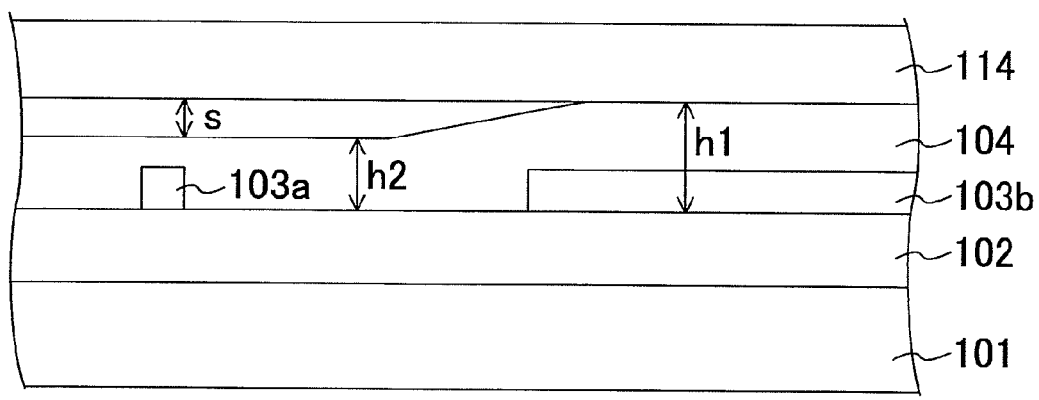
FIG. 41 is a cross-sectional view showing a state where a device portion is bonded with a glass substrate in the conventional manufacturing process of a semiconductor device.

Moreover, the first embodiment was described with respect to an example in which the device portion D is bonded with the glass substrate 36. However, as shown in a cross-sectional view of FIG. 36, the PMOS transistor 26p and the NMOS transistor 26n of the device portion D bonded with the glass substrate 36 may be electrically connected to electric devices 60 formed in advance on the glass substrate 36.

That is, in the bonding step, the device portion D is bonded with the glass substrate 36 having electric devices, such as active devices and passive devices, formed thereon in advance. Then, a protective film 37 is formed over the glass substrate 36 so as to cover the device portion D and the electric devices 60. Then, contact holes 61 are formed in the device portion D so as to expose conductive films (source electrodes and drain electrodes) 31 at the bottoms of the contact holes 61. On the other hand, on the lateral sides of the device portion D, contact holes 62 are formed in the protective film 37 so as to expose the electric devices 60. Then, metal interconnects are patterned so as to connect the electric devices 60 with the conductive films (the source electrodes or the drain electrodes) 31 via the contact holes 61, 62, respectively. The semiconductor device S may be manufactured in this manner. Note that, although the electric devices 60 have various structures, such as a transistor, a diode, and a capacitor, in actual applications, the electric devices 60 are shown in a simplified manner in FIG. 36.

Moreover, the first embodiment was described by using MIS transistors (the PMOS transistor 26p and the NMOS transistor 26n) as an example of the devices. However, the present invention is not limited to this, and is similarly applicable to other semiconductor devices including bipolar transistors, various diodes (diodes, light-emitting diodes, laser diodes, and photodiodes), and the like.

In the first embodiment, the planarization assisting layer 33 is formed so that the height of the planarization assisting layer 33 from the surface of the first planarizing layer 27 located on the side opposite to the silicon substrate 1 becomes equal between the entire region where the conductive films 31 are formed, and a part of the region where no conductive film 31 is formed. Moreover, in the second embodiment, the planarization assisting layer 33 is formed so that this height of the planarization assisting layer 33 becomes equal between a part of the region where the conductive films 31 are formed, and a part of the region where no conductive film 31 is formed. However, the present invention is not limited to these, and the planarization assisting layer 33 need only be formed so that this height of the planarization assisting layer 33 becomes equal between at least a part of the region where the conductive films 31 are formed, and at least a part of the region where no conductive film 31 is formed.

In the third embodiment, the planarizing insulating layer 54 is formed by removing the grooves 52 by performing a planarization process, such as a CMP method, on the surface of the base layer 50. However, the present invention is not limited to this, and the grooves need not necessarily be completely removed. That is, the planarizing insulating layer 54 may have grooves, each extending along the outer edge of a corresponding one of the conductive films 31 in at least a part of the outer periphery of the conductive film 31. Thus, even if the planarizing insulating layer 54 has the grooves, the groove width is relatively small. The groove width is sufficiently small especially in the case where each groove 52 is formed in a region of 3.0 μm or less from the outer edge of a corresponding conductive film 31. Thus, even if the grooves 52 still remain when later performing the bonding step, the device portion D can be reliably bonded with the substrate 36.

That is, in the device portion forming step, the planarizing insulating layer 54 need only be formed so that the height of the planarizing insulating layer 54 from the surface of the planarizing layer located on the side opposite to the silicon substrate becomes equal between the entire region where the conductive films 31 are formed, and at least a part of the region where no conductive film 31 is formed, and becomes the highest in the region where the conductive films 31 are formed.

INDUSTRIAL APPLICABILITY

As described above, the present invention is useful for semiconductor devices that are applied to LCD devices and the like, and manufacturing methods thereof, and is especially suitable for the case of reducing the thickness of a device portion having a plurality of conductive films, and reliably bonding the device portion with a substrate.

The invention claimed is:

1. A method for manufacturing a semiconductor device, comprising:
    a device portion forming step of forming a device portion by forming a device formed in a substrate layer, then forming a first planarizing layer covering at least a part of the device and having at least one contact hole, then, forming a plurality of conductive films including at least one conductive film connected to the device through the at least one contact hole on a surface of the first planarizing layer, and then, forming a second planarizing, layer covering the plurality of conductive films, the device portion having the device, the first planarizing layer, the plurality of conductive films, and the second planarizing layer;
    a peel-off layer farming step of forming a peel-off layer by ion implanting a peel-off material to the substrate layer;
    a bonding step of bonding the device portion with a substrate; and
    a separating step of separating and removing a part of the substrate layer along the peel-off layer, wherein
    the device portion forming step includes an assisting layer forming step of forming a planarization assisting layer, which covers the plurality of conductive films, over the first planarizing layer before forming the second planarizing layer, and
    in the assisting layer forming step, the planarization assisting layer is formed so that a height of the planarization assisting layer from a surface of the first planarizing layer located on a side opposite to the substrate layer becomes equal between at least a part of a region where the conductive films are formed, and at least a part of a region where no conductive film is formed.

2. A method for manufacturing a semiconductor device, comprising:
    a device portion forming step of forming a device portion by forming a device formed in a substrate layer, then, forming a planarizing layer covering at least a part of the device, and having at least one contact hole, then, forming a plurality of conductive films including, at least one conductive film connected to the device through the at least one contact hole on a surface of the planarizing layer, and then, forming an insulating layer covering the plurality of conductive films, the device portion having the device, the planarizing layer, the plurality of conductive films, and the insulating layer:
    a peel-off layer forming step of forming a peel-off layer by ion implanting a peel-off material to the substrate layer;
    a bonding step of bonding the device portion with a substrate; and
    a separating step of separating and removing a part of the substrate layer along the peel-off layer, wherein
    in the device portion forming step, the insulating layer is formed so that a height of the insulating layer from a surface of the planarizing layer located on a side opposite to the substrate layer becomes equal between an entire region where the conductive films are formed, and at least a part of a region where no conductive film is formed, and becomes the highest in the region where the conductive films are formed.

3. The method of claim 1, wherein
in the assisting layer forming step, after a base layer, which covers the plurality of conductive films, is formed over the first planarizing layer, convex portions, formed in the base layer so as to reflect a difference in level between a surface of the first planarizing layer and surfaces of the conductive films, are at least partially etched to form the planarization assisting layer.

4. The method of claim 3, wherein
in the assisting layer forming step, each of the convex portions is entirely etched with a width of 3.0 μm or less from an outer edge of a corresponding one of the conductive films when viewed from a direction normal to a surface of the substrate layer.

5. The method of claim 3, wherein
in the assisting layer forming step, the convex portions are etched so that a part of each convex portion is left with a width of 3.0 μm or less in a direction perpendicular to an outer edge of a corresponding one of the conductive films when viewed from a direction normal to a surface of the substrate layer.

6. The method of claim 2, wherein
in the device portion forming step, after a base layer, which covers the plurality of conductive films, is formed over the planarizing layer, convex portions, formed in the base layer so as to reflect a difference in level between a surface of the planarizing layer and surfaces of the conductive films, are at least partially etched to form the insulating layer.

7. The method of claim 6, wherein
in the device portion forming step, each of the convex portion is entirely etched with a width of 3.0 μm or less from an outer edge of a corresponding one of the conductive films when viewed from a direction normal to a surface of the substrate layer.

8. The method of claim 6, wherein
in the device portion forming step, after the convex portions are etched so that a part of each convex portion is left with a width of 3.0 μm or less in a direction perpendicular to an outer edge of a corresponding, one of the conductive films when viewed from a direction normal to a surface of the substrate layer, a surface of the base layer is planarized to remove the part of each convex portion which is left in the base layer.

9. The method of claim 1, wherein
the peel-off material contains at least one of hydrogen and an inert gas element.

10. The method of claim 1, wherein
the substrate layer contains at least one semiconductor selected from the group consisting of group IV semiconductors, group II-VI compound semiconductors, group III-V compound semiconductors, group IV-IV compound semiconductors, alloys containing homologous elements thereof, and oxide semiconductors.

11. The method of claim 1, wherein
the substrate is a glass substrate or a semiconductor substrate.

12. The method of claim 1, wherein
the plurality of conductive films are made of a metal material.

13. The method of claim 12, wherein
the metal material is at least one of TiN, TaN, HfN, ZrN, NbN, W, Mo, Ti, Ta, Co, Ni, Pt, Cu, Ag, and Au.

* * * * *